(12) United States Patent
Oyamada

(10) Patent No.: US 8,059,220 B2
(45) Date of Patent: Nov. 15, 2011

(54) ELECTRO-OPTICAL DEVICE, METHOD FOR PRODUCTION OF ELECTRO-OPTICAL DEVICE, AND ELECTRONIC APPARATUS

(75) Inventor: Shin Oyamada, Hokkaido (JP)

(73) Assignee: Seiko Epson Corporation, Tokyo (JP)

( * ) Notice: Subject to any disclaimer, the term of this patent is extended or adjusted under 35 U.S.C. 154(b) by 975 days.

(21) Appl. No.: 12/008,887

(22) Filed: Jan. 15, 2008

(65) Prior Publication Data

US 2008/0198284 A1 Aug. 21, 2008

(30) Foreign Application Priority Data

Feb. 19, 2007 (JP) ................................. 2007-037446

(51) Int. Cl.
*G02F 1/1343* (2006.01)
(52) U.S. Cl. ........................................................ 349/39
(58) Field of Classification Search .................. None
See application file for complete search history.

(56) References Cited

U.S. PATENT DOCUMENTS

| 7,570,311 | B2 * | 8/2009 | Moriwaki | 349/38 |
|---|---|---|---|---|
| 7,671,942 | B2 * | 3/2010 | Nam et al. | 349/114 |
| 7,675,582 | B2 * | 3/2010 | Luo et al. | 349/39 |
| 7,683,988 | B2 * | 3/2010 | Lin et al. | 349/114 |
| 7,763,942 | B2 * | 7/2010 | Chen et al. | 257/359 |
| 2006/0011979 | A1 * | 1/2006 | Moriwaki | 257/347 |
| 2006/0119753 | A1 * | 6/2006 | Luo et al. | 349/38 |
| 2006/0215068 | A1 * | 9/2006 | Nakagawa | 349/38 |
| 2008/0198284 | A1 * | 8/2008 | Oyamada | 349/39 |

FOREIGN PATENT DOCUMENTS

JP 2006-276118 10/2006

* cited by examiner

*Primary Examiner* — Timothy L Rude
(74) *Attorney, Agent, or Firm* — AdvantEdge Law Group, LLC

(57) ABSTRACT

An electro-optical device includes a substrate, a pixel, a transistor, an inter-bedded insulation film, a storage capacitor, an underlying surface, a spacer insulation film, and a first dummy pattern. The spacer insulation film extends across a boundary between the main portion and an extension portion of the lower capacitor electrode of the capacitor and is in a non-overlapping condition with a part of the main portion in a plan view. The first dummy pattern is formed in the open region over the substrate, and is made of the same film as that of the spacer insulation film.

9 Claims, 11 Drawing Sheets

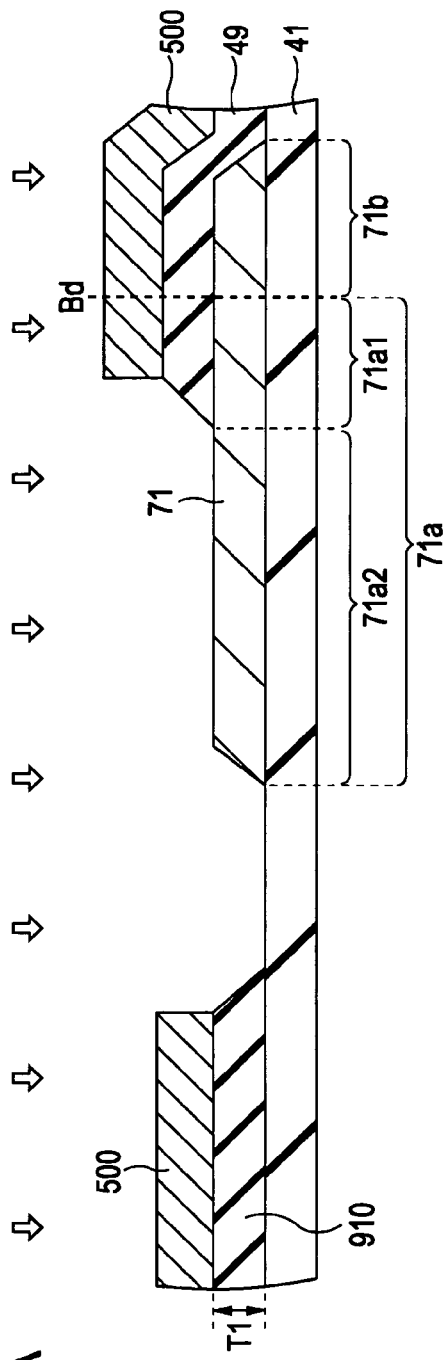
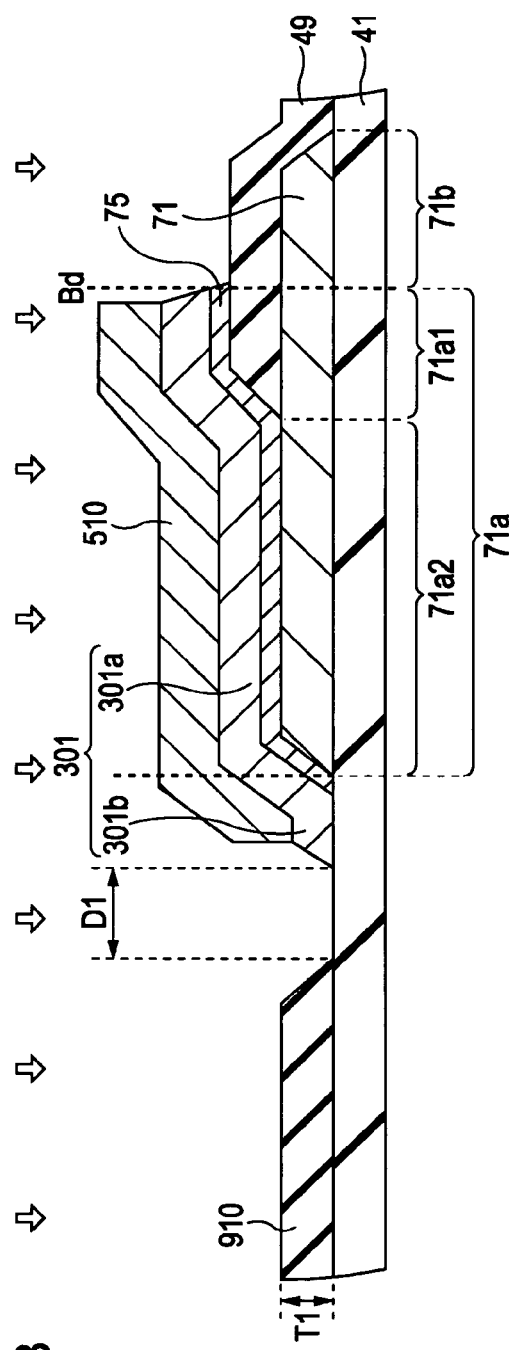
FIG. 10A
FIG. 10B

ELECTRO-OPTICAL DEVICE, METHOD FOR PRODUCTION OF ELECTRO-OPTICAL DEVICE, AND ELECTRONIC APPARATUS

BACKGROUND

1. Technical Field

The present invention relates to an electro-optical device such as a liquid crystal device and a method for producing the electro-optical device. In addition, the invention further relates to an electronic apparatus such as a liquid crystal projector.

2. Related Art

In the typical configuration of an electro-optical device of the related art, an electro-optical material such as liquid crystal is sealed between a pair of substrates. A lamination structure that is made up of a plurality of pixel electrodes, a plurality of scanning lines for selectively driving the pixel electrodes, a plurality of data lines, and a plurality of thin film transistors (TFT) each of which functions as a pixel-switching element is formed over the display region of an element substrate, which constitutes one of the above-mentioned pair of substrates. In such a lamination structure, an inter-bedded insulation film is formed between one layer and another for providing isolation therebetween. An electro-optical device of the related art having such a configuration is capable of operating in an active-matrix driving scheme. In addition, various kinds of circuits such as a scanning line driving circuit, a data line driving circuit, and the like as well as various kinds of wirings/lines such as an image signal line and the like are also provided on the peripheral region that surrounds the display region of the element substrate so as to constitute a peripheral lamination structure. In the typical configuration of the related-art electro-optical device, a storage capacitor is provided between a TFT and a pixel electrode in order to enhance contrast. A storage capacitor is formed in the non-open region of each of a plurality of pixels in addition to a scanning line, a data line, a TFT, and the like.

In connection with the configuration of a storage capacitor, for example, JP-A-2006-276118 discloses a technique for preventing the occurrence of unwanted electric current leakage between an upper capacitor electrode and a lower capacitor electrode thereof. The related art described in the above-identified patent publications achieves the prevention of unwanted electric current leakage by increasing the inter-bedded distance (i.e., layer-to-layer distance) between an end surface of the upper capacitor electrode and an end surface of the lower capacitor electrode by means of a spacer insulation film. In the following description, the above-mentioned unwanted electric current leakage between the end surface of the upper capacitor electrode and the end surface of the lower capacitor electrode is simply referred to as "end surface electric current leakage" as long as the context allows.

In order to reduce the adverse possibility of disarrangement in the orientation state (i.e., alignment state) of an electro-optical material because of unevenness in the surface the above-mentioned lamination structure formed over the element substrate, planarization processing such as chemical mechanical polishing (CMP) is applied thereto in many of the related-art electro-optical devices.

However, if the above-mentioned spacer insulation film is formed for a storage capacitor that is formed in the non-open region whereas it is not formed in the open region, the surface level difference between the non-open region and the open region increases by the film thickness of the spacer insulation film. This poses a problem that has not been addressed by the related art in that the increased surface level difference between the non-open region and the open region makes it practically impossible, or at least difficult, to smoothen the lamination surface of the element substrate.

SUMMARY

An advantage of some aspects of the invention is to provide an electro-optical device that features enhanced evenness in the lamination surface of a substrate, thereby making it possible to display a high-quality image, and to provide a method for manufacturing such an electro-optical device. In addition, the invention further provides, advantageously, an electronic apparatus that is provided with such an electro-optical device.

In order to address the above-identified problem without any limitation thereto, the invention provides, as a first aspect thereof, an electro-optical device including: a substrate; a plurality of pixel electrodes formed over the substrate; a plurality of transistors each of which is formed over the substrate in a non-open region that isolates an open region of one pixel electrode from an open region of another pixel electrode, each of the plurality of transistors being electrically connected to the corresponding one of the plurality of pixel electrodes; a plurality of storage capacitors each of which is formed over the substrate at a layer below the pixel electrode with at least one inter-bedded insulation film being interposed therebetween, the storage capacitor having a lower capacitor electrode, a dielectric film, and an upper capacitor electrode that are deposited in the order of appearance herein, the lower capacitor electrode having a lower capacitor electrode main portion that overlaps the upper capacitor electrode in a plan view over the substrate and a lower capacitor electrode extension portion that extends from one part of the lower capacitor electrode main portion in such a manner that the lower capacitor electrode extension portion does not overlap the upper capacitor electrode in a plan view; a plurality of spacer insulation films formed over the substrate each of which is formed at a layer above an underlying surface of the lower capacitor electrode but below the upper capacitor electrode, the spacer insulation film extending across a boundary between the lower capacitor electrode main portion and the lower capacitor electrode extension portion in a plan view to cover the above-mentioned one part of the lower capacitor electrode main portion, the spacer insulation film not overlapping other part of the lower capacitor electrode main portion in a plan view; and a plurality of first dummy patterns each of which is formed in the open region over the substrate, the first dummy pattern being made of the same film as that of the spacer insulation film.

In the configuration of an electro-optical device according to the first aspect of the invention described above, as a non-limiting example of operation of its components, when a transistor provided in each pixel is selectively driven by a signal supplied from a scanning line that is electrically connected to the transistor, a data signal such as an image signal is supplied from a data line to the transistor; and then, the supplied signal is further applied to a pixel electrode via the transistor. By this means, the electro-optical device according to the first aspect of the invention described above is capable of operating in an active-matrix driving scheme. In such an active-matrix driving operation, thanks to the functioning of a storage capacitor, the electric potential retention property at the pixel electrode is improved, which makes it possible to achieve an enhanced contrast in image display.

When viewed in two dimensions, that is, in a plan view, a transistor, a storage capacitor, and wirings/lines such as a data line, a scanning line, and the like are arranged inside a non-open region that provides an isolation between each two adjacent ones of open regions (i.e., aperture regions) of pixel electrodes (or, in other words, pixels corresponding to the pixel electrodes) on a substrate. Herein, the term "open region" means a region in each pixel electrode (or, in other words, each pixel) which transmits or reflects light that actually contributes to display, whereas the term "non-open region" means a region which blocks and shuts off light. In other words, a transistor, a storage capacitor, and wirings/lines such as a data line, a scanning line, and the like are arranged not in the open region of each pixel but in the non-open region thereof so as not to obstruct display.

In the configuration of an electro-optical device according to the first aspect of the invention described above, a spacer insulation film is formed for each storage capacitor. A lower capacitor electrode, which constitutes a part of a storage capacitor, has a lower capacitor electrode main portion and a lower capacitor electrode extension portion. The lower capacitor electrode main portion overlaps an upper capacitor electrode in a plan view over a substrate. The lower capacitor electrode extension portion extends from one part of the lower capacitor electrode main portion in such a manner that the lower capacitor electrode extension portion does not overlap the upper capacitor electrode in a plan view over the substrate. The spacer insulation film is formed at a layer above an underlying surface of the lower capacitor electrode but below the upper capacitor electrode. In a plan view, the spacer insulation film extends across a boundary between the lower capacitor electrode main portion and the lower capacitor electrode extension portion to cover the above-mentioned one part of the lower capacitor electrode main portion. It should be particularly noted that the spacer insulation film does not overlap other part of the lower capacitor electrode main portion in a plan view. That is, in a typical configuration, the spacer insulation film is formed to overlie the above-mentioned one part of the lower capacitor electrode main portion and the lower capacitor electrode extension portion (or in other words, the spacer insulation film is formed to include the boundary between the lower capacitor electrode main portion and the lower capacitor electrode extension portion) between the upper capacitor electrode and the lower capacitor electrode in the lamination structure of the substrate. The spacer insulation film is formed to overlie the above-mentioned one part of the lower capacitor electrode main portion, whereas the spacer insulation film is formed not to overlie the above-mentioned other part of the lower capacitor electrode main portion. That is, although a dielectric film is formed between the upper capacitor electrode and the above-mentioned other part of the lower capacitor electrode main portion in the lamination structure of the substrate, the spacer insulation film is not formed therebetween. This means that the above-mentioned other part of the lower capacitor electrode main portion substantially functions as a capacitor electrode. It should be noted that the layer position of the spacer insulation film could be modified within the technical scope of the invention as long as the spacer insulation film is interposed between the upper capacitor electrode and the lower capacitor electrode in the lamination structure formed over the substrate. For example, the spacer insulation film may be formed above the dielectric film. Or, the spacer insulation film may be formed below the dielectric film. Moreover, the spacer insulation film could be modified within the technical scope of the invention in such a manner that the spacer insulation film may have a portion that extends, from an interlayer portion that is interposed between the upper capacitor electrode and the lower capacitor electrode in the lamination structure formed on the substrate, onto the underlying surface of the lower capacitor electrode in such a manner that the spacer insulation film does not overlap the lower capacitor electrode in a plan view.

Therefore, the spacer insulation film is interposed between the upper capacitor electrode and the above-mentioned one part of the lower capacitor electrode main portion, where the end surface of the upper capacitor electrode lies over the spacer insulation film at the boundary between the lower capacitor electrode main portion and the lower capacitor electrode extension portion. Accordingly, since the spacer insulation film is interposed at the boundary between (the above-mentioned one part of) the lower capacitor electrode main portion and the lower capacitor electrode extension portion, in comparison with a case where the spacer insulation film is not provided therebetween at the boundary, it is possible to increase the inter-bedded distance between the end surface of the lower capacitor electrode and the end surface of the upper capacitor electrode. By this means, it is possible to prevent the occurrence of end surface electric current leakage. The term "inter-bedded distance" means a layer-to-layer distance that is measured along a direction perpendicular to the plane (i.e., surface) of the substrate and the layers formed thereon, or in other words, along a lamination direction, which is the vertical direction. In addition, when an etching treatment or other similar treatment is applied at the above-mentioned one part of the lower capacitor electrode main portion so as to etch away the upper capacitor electrode, the presence of the spacer insulation film ensures that the lower capacitor electrode (or the dielectric film and the lower capacitor electrode) is protected from an etchant so that it is not subjected to any unintended etching thereof. This can be paraphrased as follows. Since the spacer insulation film provides such protection, it is possible to easily process the end/edge portion of the upper capacitor electrode by means of an etching treatment. That is, it is possible to improve the workability of the end/edge portion of the upper capacitor electrode. Therefore, the configuration of an electro-optical device according to the first aspect of the invention described above makes it possible to effectively avoid the generation of end surface electric current leakage due to the propinquity (i.e., nearness or close arrangement) of the end surface of the upper capacitor electrode and the end surface of the lower capacitor electrode with an inter-bedded insulation film or the like being interposed therebetween.

In the configuration of an electro-optical device according to the first aspect of the invention described above, a first dummy pattern that is made of the same film as that of the spacer insulation film is provided in the open region of each of the plurality of pixel electrodes. In the context of this specification and appended claims, the term "same film" means two (or more) films that are formed concurrently with each other (or one another) in the same single film formation process. Thus, it means the same single kind of film. It should be noted that, in the context of this specification and appended claims, the phrase "is made of the same film" does not mean that two (or more) elements are formed together as a single sheet of film having a "non-isolated pattern". The phrase "is made of the same film" applies two (or more) elements that are isolated (i.e., have an isolated pattern) from each other (or one another) though they constitute the same single kind of film. The first dummy pattern is formed, for example, in an "island-shape" in the center of the open region of each of the plurality of pixel electrodes that are arrayed in a matrix pattern in the pixel region (e.g., image display region). With such a layout configuration, the first dummy pattern is also arrayed in a matrix pattern.

Thanks to the presence of the first dummy pattern, it is possible to decrease the difference in the surface level of the lamination structure formed at the open region and the surface level of the lamination structure formed at the non-open region over the substrate. That is, since the first dummy pattern, which is made of the same film as that of the spacer insulation film, is formed in the open-region of the pixel electrode, it is possible to "imitate" the raised lamination surface level of the lamination structure in the non-open region thereof due to the film thickness of the spacer insulation film that is formed therein. In other words, thanks to the presence of the first dummy pattern, it is possible to almost eliminate any significant unevenness in the lamination surface formed in the open region and the non-open region over the substrate. Thus, after application of planarization processing such as CMP to the surface of the lamination structure formed over the substrate for elimination of unevenness thereof, or more specifically, after application of planarization processing such as CMP to the surface of an inter-bedded insulation film that is formed at a layer below the pixel electrode for elimination of unevenness thereof, the configuration of an electro-optical device according to the first aspect of the invention described above makes it possible to enhance the surface smoothness thereof. By this means, it is possible to reduce the adverse possibility of disarrangement in the orientation state of an electro-optical material such as liquid crystal or the like. Furthermore, for example, it is possible to reduce the adverse possibility of a wire breakage in wiring formed on an inter-bedded insulation film that is deposited above the first dummy pattern and the spacer insulation film.

In addition, since the first dummy pattern is made of the same film as that of the spacer insulation film, advantageously, the configuration of an electro-optical device according to the first aspect of the invention described above does not require any more complex lamination structure of the substrate or any more complex manufacturing steps at all. Or, even when a slight and/or minor complication thereof is involved, the configuration of an electro-optical device according to the first aspect of the invention described above does not sacrifice the simple lamination structure of the substrate or simple manufacturing steps thereof.

As explained above, with the configuration of an electro-optical device according to the first aspect of the invention described above, since the first dummy pattern that is made of the same film as that of the spacer insulation film is provided in the open region of each of the plurality of pixel electrodes, it is possible to reduce the difference in the surface level between the lamination structure formed in the open region of the substrate and the surface level of the lamination structure formed in the non-open region thereof. By this means, it is possible to enhance the surface flatness of the substrate.

In the configuration of an electro-optical device according to the first aspect of the invention described above, it is preferable that any one or more of the above-mentioned at least one inter-bedded insulation film is (i.e., has been) subjected to planarization processing.

In the preferred configuration of an electro-optical device according to the first aspect of the invention described above, an inter-bedded insulation film that has been subjected to planarization processing such as CMP, though not limited thereto, is deposited at a layer above the storage capacitor. With such a configuration, it is possible to planarize the surface of the inter-bedded insulation film while enhancing smoothness thereof. Thanks to the presence of the first dummy pattern, it is possible to reduce the difference in the surface level between the lamination structure formed in the open region of the substrate and the surface level of the lamination structure formed in the non-open region thereof.

By this means, it is possible to enhance the surface flatness of the inter-bedded insulation film after being subjected to planarization processing.

It is preferable that the electro-optical device according to the first aspect of the invention described above should further include a first inter-bedded insulation film as the above-mentioned at least one inter-bedded insulation film, the first inter-bedded insulation film being formed above the upper capacitor electrode, wherein the upper capacitor electrode has an upper capacitor electrode main portion that overlaps the lower capacitor electrode main portion in a plan view and an upper capacitor electrode extension portion that extends from the upper capacitor electrode main portion in such a manner that the upper capacitor electrode extension portion does not overlap the lower capacitor electrode in a plan view; and a gap distance between the upper capacitor electrode extension portion and an edge portion of the first dummy pattern that faces the upper capacitor electrode extension portion is smaller than twice of a value obtained by multiplying a film thickness of the first inter-bedded insulation film by a coverage percentage of the first inter-bedded insulation film.

In the preferred configuration of an electro-optical device according to the first aspect of the invention described above, the upper capacitor electrode has an upper capacitor electrode main portion and an upper capacitor electrode extension portion. The upper capacitor electrode main portion overlaps the lower capacitor electrode main portion in a plan view. The upper capacitor electrode extension portion extends onto the underlying surface of the lower capacitor electrode in such a manner that the upper capacitor electrode extension portion does not overlap the lower capacitor electrode in a plan view. That is, the upper capacitor electrode extension portion extends from the upper capacitor electrode main portion, which overlies the lower capacitor electrode main portion, onto the underlying surface of the lower capacitor electrode in such a manner that the upper capacitor electrode extension portion covers the end surface of the lower capacitor electrode main portion (more exactly, the end surface of the above-mentioned other part of the lower capacitor electrode main portion). With such a configuration, it is possible to increase the capacitance area by effectively utilizing the end surface of (the above-mentioned other part of) the lower capacitor electrode main portion. Therefore, it is possible to increase a capacitance value in the non-open region, which is a space-limited area over the substrate, without any necessity to increase the layout area of the storage capacitor itself over the substrate. As a non-limiting example of modified configurations, the upper capacitor electrode extension portion may have a portion that is formed over the underlying surface of the lower capacitor electrode with the dielectric film being interposed therebetween. Or, the upper capacitor electrode extension portion may have a portion that is formed directly over the underlying surface of the lower capacitor electrode.

In addition, in the preferred configuration of an electro-optical device according to the first aspect of the invention described above, a gap distance between the upper capacitor electrode extension portion and an edge portion of the first dummy pattern that faces the upper capacitor electrode extension portion is smaller than twice of a value obtained by multiplying a film thickness of the first inter-bedded insulation film by a coverage percentage of the first inter-bedded insulation film. That is, in the preferred configuration of an electro-optical device according to the first aspect of the invention described above, the following mathematical formula holds true: Gap Distance (the gap interval between the upper capacitor electrode extension portion and the edge portion of the first dummy pattern that faces the upper capacitor electrode extension portion)<Film Thickness (the film thickness of the first inter-bedded insulation film)×Coverage Percentage (the coverage percentage of the first inter-bedded insulation film)×2. Herein, the term "coverage percentage" in the context of this specification and appended claims is defined as a percentage in terms of which a film covers an object. Specifically, the coverage percentage is mathematically defined as the ratio of the film thickness of a layer portion that covers the upper surface of an object to the film thickness of a layer portion that covers the side surface thereof. This is mathematically expressed as follows: Coverage Percentage=Film Thickness TU (the film thickness of a layer portion that covers the upper surface of an object)/Film Thickness TS (the film thickness of a layer portion that covers the side surface thereof). According to the definition given above, the gap distance between the upper capacitor electrode extension portion and the edge portion of the first dummy pattern that faces the upper capacitor electrode extension portion is smaller than twice of a value obtained by multiplying the film thickness of the first inter-bedded insulation film by the coverage percentage of the first inter-bedded insulation film. Therefore, it is possible to form a concave portion that is formed as a combination of the edge surface of the first dummy pattern, the underlying surface of the lower capacitor electrode, and the opposite surface of the upper capacitor electrode extension portion in such a manner that the concave portion has a relatively small width. Thus, in the preferred configuration of an electro-optical device according to the first aspect of the invention described above, it is possible to fill up the concave portion that is formed as a combination of the edge surface of the first dummy pattern, the underlying surface of the lower capacitor electrode, and the opposite surface of the upper capacitor electrode extension portion either completely or almost completely by means of the first inter-bedded insulation film, thereby effectively reducing the surface level difference of the first inter-bedded insulation film. In other words, the preferred configuration of an electro-optical device according to the first aspect of the invention described above makes it possible to effectively avoid the undesirable formation of a corresponding overlying concave portion in the surface of the first inter-bedded insulation film, which is attributable to the presence of the underlying wide concave portion described in the preceding sentence.

In the preferred configuration of an electro-optical device according to the first aspect of the invention described above, which is preferably provided with the first inter-bedded insulation film, it is more preferable that the electro-optical device should further include a first wiring that is made of an electro-conductive film, the first wiring being formed on the first inter-bedded insulation film, wherein the gap distance is larger than twice of a value obtained by multiplying a film thickness of the first wiring by a coverage percentage of the first wiring.

In the preferred configuration of an electro-optical device described above, a first wiring such as a data line, a capacitor line, though not limited thereto, is formed on the first inter-bedded insulation film. In addition, the gap interval between the upper capacitor electrode extension portion and the edge portion of the first dummy pattern that faces the upper capacitor electrode extension portion is larger than twice of a value obtained by multiplying the film thickness of the first wiring by the coverage percentage of the first wiring. That is, in the preferred configuration of an electro-optical device described above, the following mathematical formula holds true: Gap Distance (the gap interval between the upper capacitor electrode extension portion and the edge portion of the first dummy pattern that faces the upper capacitor electrode extension portion)>Film Thickness (the film thickness of the first wiring)×Coverage Percentage (the coverage percentage of the first wiring)×2. As defined in the mathematical formula given above, the gap distance between the upper capacitor electrode extension portion and the edge portion of the first dummy pattern that faces the upper capacitor electrode extension portion is larger than twice of a value obtained by multiplying the film thickness of the first wiring by the coverage percentage of the first wiring. Therefore, it is possible to widen a concave portion that is formed as a combination of the edge surface of the first dummy pattern, the underlying surface of the lower capacitor electrode, and the opposite surface of the upper capacitor electrode extension portion to a degree where there is no adverse effect on the formation of the first wiring. That is, in the manufacturing process of the first wiring, which is performed by, as a first step, forming a precursor film, that is, a pre-etching film, on the surface of the first inter-bedded insulation film, and as a second step, by applying an etching treatment on the formed precursor film so as to form the first wiring, it is possible to prevent any part of the precursor film from remaining without being removed in a corresponding overlying concave portion formed in the surface of the first inter-bedded insulation film, which is attributable to the presence of the underlying concave portion that is defined by three surfaces, that is, the edge surface of the first dummy pattern, the underlying surface of the lower capacitor electrode, and the opposite surface of the upper capacitor electrode extension portion. It should be noted that the film thickness of the first wiring is smaller than that of the first inter-bedded insulation film.

It is preferable that the electro-optical device according to the first aspect of the invention described above should further include a peripheral circuit section that is formed at a peripheral region that surrounds a pixel region over the substrate in which the plurality of pixel electrodes are formed, the peripheral circuit section functioning to drive the plurality of pixel electrodes.

In the preferred configuration of an electro-optical device according to the first aspect of the invention described above, a peripheral circuit section that has, without any limitation thereto, peripheral circuits that includes a data line driving circuit and a scanning line driving circuit provided for driving a plurality of pixel electrodes as well as a peripheral wiring pattern that includes an image signal line, a power line, and the like is formed at the peripheral region that surrounds the pixel region. The peripheral circuit section is made of the same film as a semiconductor film or an electro-conductive film that constitutes a variety of electronic elements or wirings/lines such as a transistor, a storage capacitor, and the like that are formed in each of the plurality of pixels. The peripheral circuit section formed at the peripheral region has a layout density that is higher than that of the transistors, the storage capacitors, the data lines, or the scanning lines that are formed in the pixel region. Accordingly, the first dummy pattern that is formed in each of the open regions of the pixel region makes it possible to effectively reduce the undulation or surface level difference due to the convex/concave density over the substrate, which is referred to as a global level difference. Therefore, when applied to a typical configuration of an electro-optical device in which an electro-optical material such as liquid crystal is sandwiched between a substrate having an element lamination structure (i.e., element substrate) and a counter substrate that is provided opposite to the substrate having the element lamination structure, an electro-optical device according to the first aspect of the invention described above makes it possible to offer great flatness in the lamination surface of the substrate thereof that is almost free from the global level difference. With such a unique configuration, it is possible to reduce the adverse possibility of disarrangement in the orientation state of the electro-optical material, which makes it further possible to offer a high-quality display image. If there is the above-mentioned global level difference, contrast unevenness and/or brightness unevenness might be observed as a perceivable difference between the central region of the pixel region (e.g., image display region) and the peripheral region thereof. In contrast, the configuration of an electro-optical device according to the first aspect of the invention described above makes it possible to effectively reduce or prevent the generation of such display unevenness.

In the preferred configuration of an electro-optical device according to the first aspect of the invention described above, which is preferably provided with the peripheral circuit section, it is more preferable that the electro-optical device should have a second dummy pattern that is formed in the peripheral region, the second dummy pattern being made of the same film as that of the spacer insulation film.

In such a preferred configuration, the second dummy pattern may be formed as, for example, a "solid" pattern in the peripheral region. With such a configuration, the second dummy pattern makes it possible to reduce the global level difference that could occur in the lamination surface of the substrate even in a case where the density of the peripheral circuit section in the peripheral region is relatively low.

In order to address the above-identified problem without any limitation thereto, the invention provides, as a second aspect thereof, an electronic apparatus that is provided with an electro-optical device having the configuration described above, including its preferred configurations.

According to an electronic apparatus of the second aspect of the invention, it is possible to embody various kinds of electronic devices that are capable of providing a high-quality image display, including but not limited to, a television, a mobile phone, an electronic personal organizer, a word processor, a viewfinder-type video tape recorder, a direct-monitor-view-type video tape recorder, a workstation, a videophone, a POS terminal, a touch-panel device, and so forth because it is provided with the electro-optical device having the configuration described above. In addition, an electronic apparatus of this aspect of the invention further makes it possible to embody a variety of image formation apparatuses such as a printer, a copying machine, a facsimile machine that adopts the electro-optical device having the configuration described above. In addition, as an example of an electronic apparatus of this aspect of the invention, it is possible to embody an electrophoresis apparatus such as an electronic paper. Further in addition, as another example of an electronic apparatus of this aspect of the invention, it is possible to embody a variety of electron emission devices such as a field emission display (FED), a surface-conduction electron-emitter display (SED), and the like.

In order to address the above-identified problem without any limitation thereto, the invention provides, as a third aspect thereof, a method for producing an electro-optical device that has a substrate, a plurality of pixel electrodes formed over the substrate, a plurality of transistors formed over the substrate, and a plurality of storage capacitors formed over the substrate, the method for producing an electro-optical device including: forming each of the plurality of transistors in a non-open region that isolates an open region of one pixel electrode from an open region of another pixel electrode; forming each of the plurality of storage capacitors in the non-open region that has a lower capacitor electrode, a dielectric film, and an upper capacitor electrode that are deposited in the order of appearance herein; and forming each of the plurality of pixel electrodes at a layer above the storage capacitor with at least one inter-bedded insulation film being interposed therebetween, each of the plurality of pixel electrodes being electrically connected to the corresponding one of the plurality of transistors, wherein the above-mentioned formation of each of the plurality of storage capacitors includes, sub-forming the lower capacitor electrode that has a lower capacitor electrode main portion that overlaps the upper capacitor electrode in a plan view over the substrate and a lower capacitor electrode extension portion that extends from one part of the lower capacitor electrode main portion in such a manner that the lower capacitor electrode extension portion does not overlap the upper capacitor electrode in a plan view, and sub-forming each of a plurality of spacer insulation films over the substrate at a layer above an underlying surface of the lower capacitor electrode but below the upper capacitor electrode, the spacer insulation film extending across a boundary between the lower capacitor electrode main portion and the lower capacitor electrode extension portion in a plan view to cover the above-mentioned one part of the lower capacitor electrode main portion, the spacer insulation film not overlapping other part of the lower capacitor electrode main portion in a plan view, while concurrently sub-forming each of a plurality of first dummy patterns in the open region over the substrate, the first dummy pattern being made of the same film as that of the spacer insulation film.

With a method for producing an electro-optical device according to the third aspect of the invention, it is possible to manufacture an electro-optical device having a novel and inventive configuration described above. In particular, it is possible to improve the surface flatness of the substrate without adding any undesirable extra complexity to the existing manufacturing steps thereof because the first dummy pattern is made of the same film as that of the spacer insulation film.

These and other features, operations, and advantages of the present invention will be fully understood by referring to the following detailed description in conjunction with the accompanying drawings.

BRIEF DESCRIPTION OF THE DRAWINGS

The invention will be described with reference to the accompanying drawings, wherein like numbers reference like elements.

FIGS. 10A and 10B is a set of sectional views (Part II) that schematically illustrates an exemplary part of the series of production steps/processes adopted for manufacturing a liquid crystal device according to the first embodiment of the invention.

DESCRIPTION OF EXEMPLARY EMBODIMENTS

With reference to the accompanying drawings, exemplary embodiments of the present invention are described below. In the following exemplary embodiments of the invention, a liquid crystal device that conforms to a TFT active-matrix driving scheme is taken as an example of various kinds of electro-optical devices according to the invention. It is assumed that the liquid crystal device explained in the following description is provided with a built-in driving circuit.

First Embodiment

With reference to FIGS. 1-7, a liquid crystal device according to a first embodiment of the invention is explained below.

First of all, an example of the general configuration of a liquid crystal device according to the present embodiment of the invention is explained below while referring to FIGS. 1 and 2.

Figure 1:
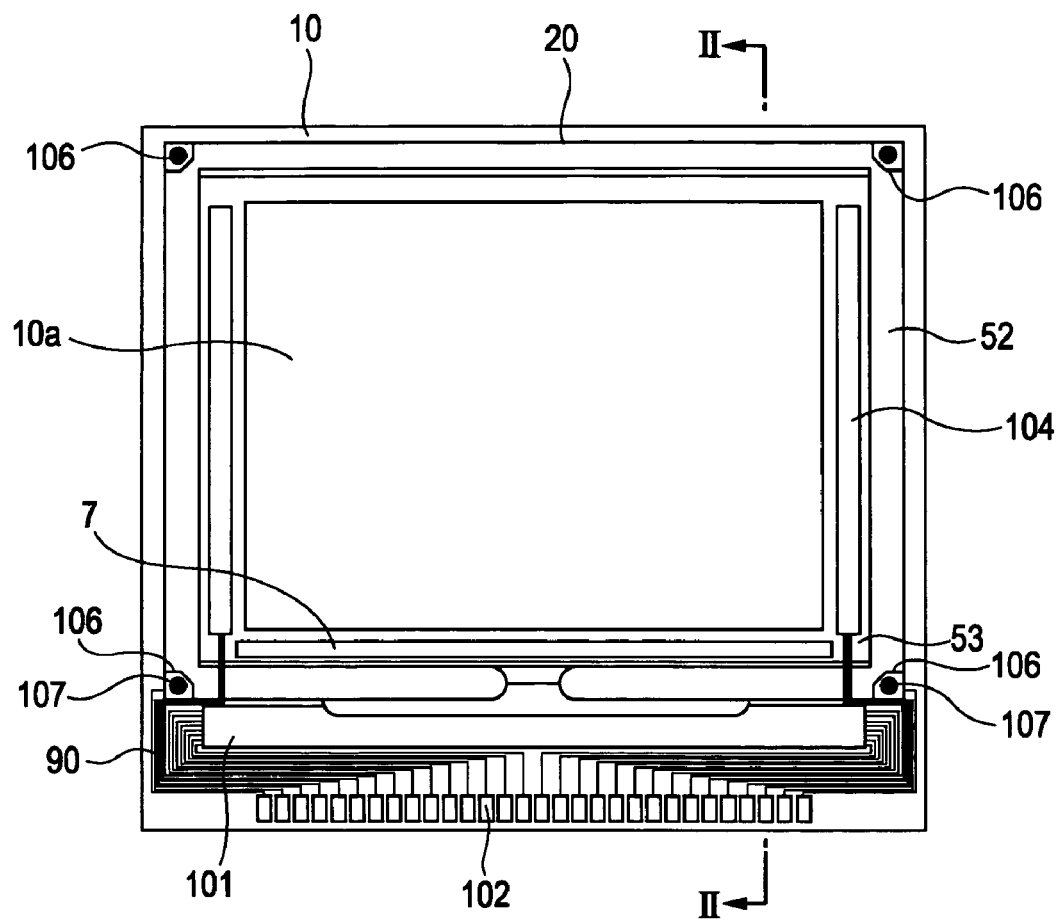
FIG. 1 is a plan view that schematically illustrates an example of the general configuration of a liquid crystal device according to a first embodiment of the invention.

FIG. 1 is a plan view that schematically illustrates an example of the configuration of a liquid crystal device according to the present embodiment of the invention. FIG. 2 is a sectional view taken along the line II-II of FIG. 1.

Figure 2:
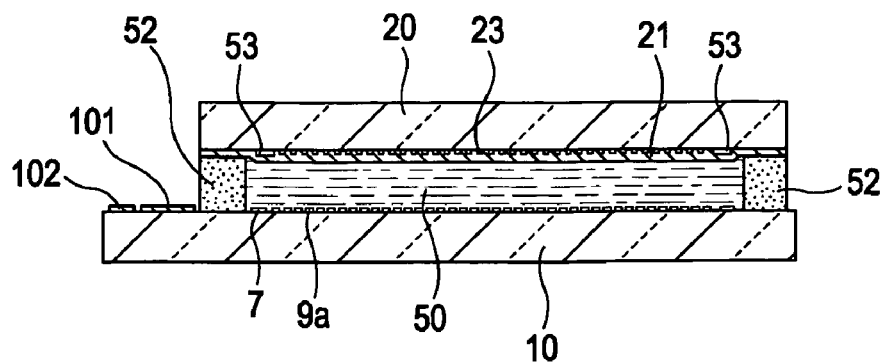
FIG. 2 is a sectional view taken along the line II-II of FIG. 1.

As shown in FIGS. 1 and 2, in the configuration of a liquid crystal device according to the present embodiment of the invention, a TFT array substrate 10 and a counter substrate 20 are arranged opposite to each other. A liquid crystal layer 50 is sealed between the TFT array substrate 10 and the counter substrate 20. The TFT array substrate 10 and the counter substrate 20 are bonded to each other with the use of a sealant material 52 that is provided at a sealing region around an image display region 10a. The image display region 10a is an example of a "pixel region" according to the invention.

Inside the sealing region at which the sealant material 52 is provided and in parallel therewith, a picture frame light-shielding film 53, which has a light-shielding property and defines the picture-frame region of the image display region 10a, is provided on the counter substrate 20 as illustrated in FIG. 1. A peripheral region surrounds the image display region 10a. In the configuration of a liquid crystal device according to the present embodiment of the invention, an area that is farther than the picture frame light-shielding film 53 when viewed from the center of the TFT array substrate 10, in other words, an area that is not inside but outside the picture frame light-shielding film 53, is defined as the peripheral region.

Among a plurality of sub-peripheral regions that make up the peripheral region described above, a data line driving circuit 101 and external circuit connection terminals 102 are provided at one sub-peripheral region which lies outside the sealing region at which the sealant material 52 is provided in such a manner that these data line driving circuit 101 and external circuit connection terminals 102 are provided along one of four sides of the TFT array substrate 10. A sampling circuit 7 is provided inside the sealing region along one of four sides thereof in such a manner that the picture frame light-shielding film 53 encloses the sampling circuit 7.

A pair of scanning line driving circuits 104 is provided inside the sealing region along two of four sides thereof that are not in parallel with the above-mentioned one side in such a manner that each of the scanning line driving circuits 104 is enclosed by the picture frame light-shielding film 53. Inter-substrate conductive terminals 106, which connect the TFT array substrate 10 with the counter substrate 20 by means of inter-substrate conductive material 107, are provided on the TFT array substrate 10 at positions corresponding to four corners of the counter substrate 20, respectively. With such a structure, it is possible to establish electric conduction between the TFT array substrate 10 and the counter substrate 20.

A wiring pattern 90 that provides an electric connection between the external circuit connection terminals 102, the data line driving circuit 101, the scanning line driving circuit 104, the inter-substrate conductive terminals 106, though not necessarily limited thereto, is formed on the peripheral region of the TFT array substrate 10. The wiring pattern 90 includes, but not limited to, an image signal line that supplies an image signal and a power potential line that supplies a power potential. It should be noted that a combination of the external circuit connection terminals 102, the data line driving circuit 101, the scanning line driving circuit 104, the inter-substrate conductive terminals 106, and the wiring pattern 90 constitutes an example of a "peripheral circuit section" according to the invention.

As illustrated in FIG. 2, a layered structure (i.e., lamination structure) that includes laminations of TFTs for pixel switching, which are driving/driver elements, and of wirings/lines such as scanning lines, data lines, and the like is formed on the image display region 10a of the TFT array substrate 10. In the image display region 10a, pixel electrodes 9a are arranged in a matrix pattern at a layer above the lamination structure of the pixel-switching TFTs, the scanning lines, the data lines, and the like. An alignment film (i.e., orientation film) is deposited on the pixel electrodes 9a. On the other hand, a light-shielding film 23 is deposited on the surface of the counter substrate 20 opposite the TFT array substrate 10. The light-shielding film 23 is made of, for example, a metal film having light-shielding property. The light-shielding film 23 is formed in a grid pattern, though not limited thereto, in the image display region 10a on the counter substrate 20. The counter electrode 21, which is made of a transparent material such as indium tin oxide (ITO) or the like, is deposited on the light-shielding film 23 in a "solid" manner, that is, as a solid electrode, so as to cover the area in such a manner that the counter electrode is opposed to the plurality of pixel electrodes 9a. Another alignment film is deposited on the counter electrode 21. The liquid crystal layer 50 is made of liquid crystal that consists of, for example, a mixture of one or more types of nematic liquid crystal element. Such a liquid crystal takes a predetermined orientation state between a pair of the above-mentioned orientation (i.e., alignment) films.

Although it is not specifically illustrated in the drawing, a test circuit, a test pattern, or other similar testing device that functions to conduct an inspection on the quality, defects, or the like, of the liquid crystal device during the production process or before shipment thereof may be further provided on the peripheral region of the TFT array substrate 10 in addition to the data line driving circuit 101 and the scanning line driving circuit 104.

Next, the basic configuration of the pixel unit (i.e., pixel portion) of a liquid crystal device according to the present embodiment of the invention is explained below with reference to FIG. 3.

Figure 3:
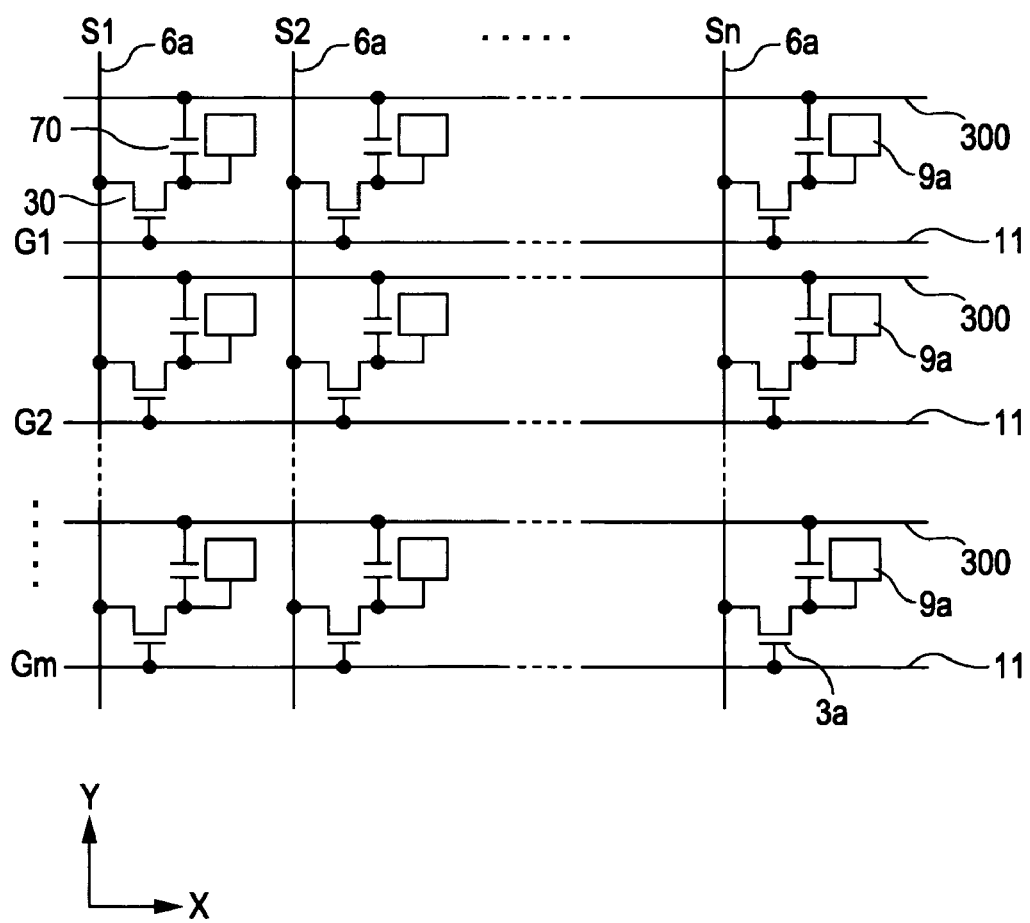
FIG. 3 is an equivalent circuit diagram that illustrates an example of a plurality of pixel units of a liquid crystal device according to the first embodiment of the invention.

FIG. 3 is an equivalent circuit diagram that illustrates major constituent elements/devices, wirings, and the like in a plurality of pixels of a liquid crystal device according to the present embodiment of the invention.

As illustrated in FIG. 3, the pixel electrode 9a and the TFT 30, the latter of which performs switching control on the former, are provided in each of the plurality of pixels that are arranged in a matrix pattern so as to constitute the image display region 10a of a liquid crystal device according to the present embodiment of the invention. The TFT 30 is an example of a "transistor" according to the invention. Each of data lines 6a to which image signals are supplied is electrically connected to the source of the TFT 30.

Image signals S1, S2, ..., and Sn that are written on the data lines 6a may be supplied respectively in this order in a line sequential manner. Alternatively, an image signal may be supplied to each of a plurality of groups that consists of an adjacent bundle of the plurality of data lines 6a.

Each of scanning lines 11 is connected to the gate of the TFT 30. A liquid crystal device according to the present embodiment of the invention is configured to apply, at a predetermined timing and in a pulse pattern, scanning signals G1, G2, ..., and Gm to the scanning lines 11 in the order of appearance herein in a line sequential manner. Each of the pixel electrodes 9a is electrically connected to the drain of the TFT 30. When the switch of the TFT 30, which functions as a switching element, is closed for a certain time period, the image signal S1, S2, ..., or Sn that is supplied through the data line 6a is written at a predetermined timing.

After being written into liquid crystal, which is an example of an electro-optical material, via the pixel electrodes 9a, the image signals S1, S2, ..., and Sn having a predetermined level are held for a certain time period between the pixel electrode 9a and the counter electrode 21 formed on the counter substrate 20. Liquid crystal changes its orientation and/or its order of molecular association depending on the level of a voltage that is applied thereto. By this means, it modulates light to realize a gradation display. Under a "normally-white" mode, the optical transmittance (i.e., light transmission factor) with respect to an incident light beam decreases in accordance with a voltage applied on a pixel-by-pixel basis (i.e., to each pixel), whereas, under a "normally-black" mode, the optical transmittance with respect to an incident light beam increases in accordance with a voltage applied on a pixel-by-pixel basis. Thus, when viewed as a whole, light having a certain contrast in accordance with an image signal is emitted from the liquid crystal device.

In order to prevent the leakage of the image signals being held, a storage capacitor 70 is added in electrically parallel with a liquid crystal capacitor that is formed between the pixel electrode 9a and the counter electrode 21 (refer to FIG. 2). One electrode of the storage capacitor 70 is connected to the drain of the TFT 30 in electrically parallel connection with the pixel electrode 9a, whereas the other electrode thereof is electrically connected to a capacitor line 300 with a fixed electric potential so as to provide a constant electric potential (i.e., potentiostatic).

Next, the specific configuration of the pixel unit of a liquid crystal device according to the present embodiment of the invention is explained below with reference to FIGS. 4 and 5.

Figure 4:
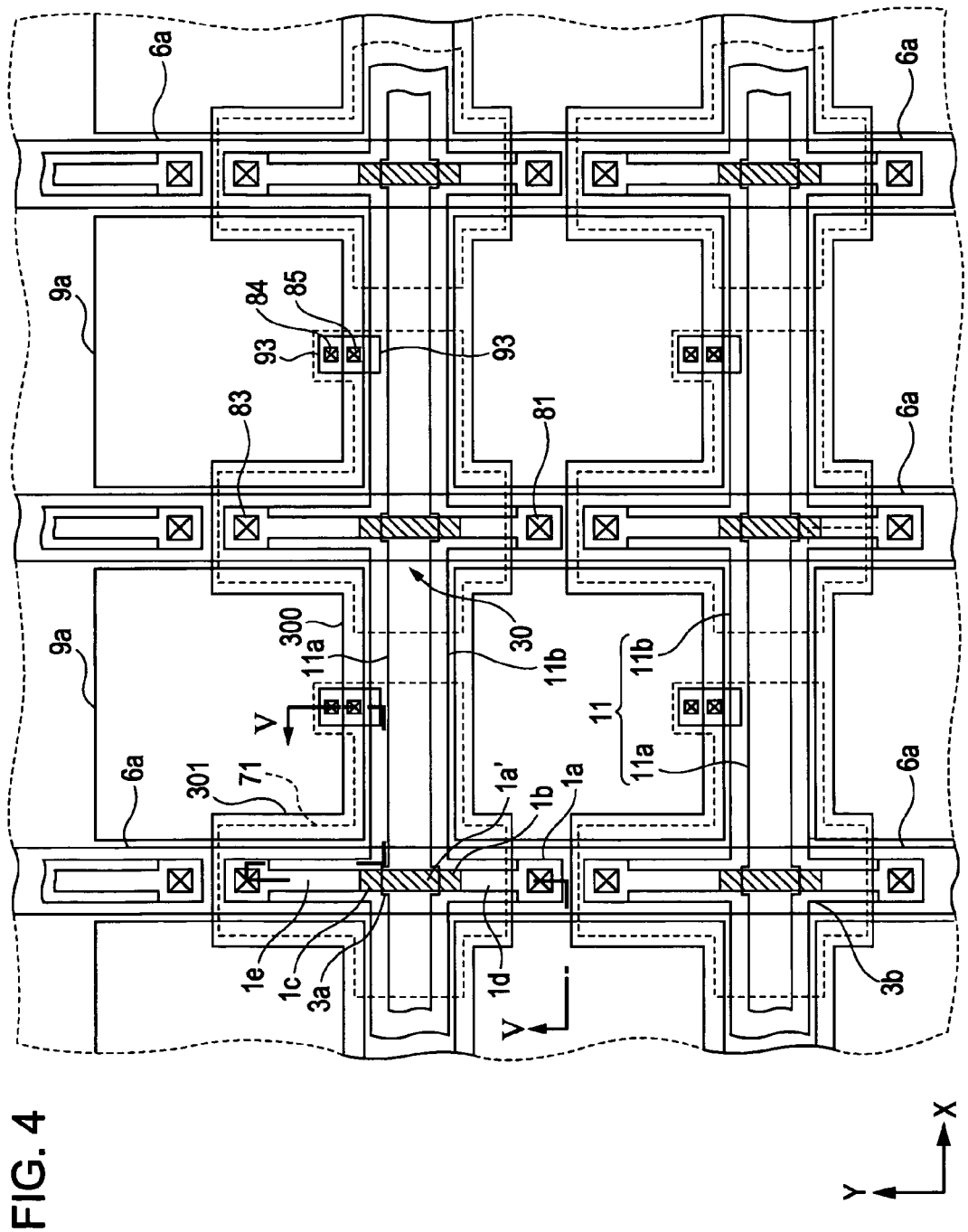
FIG. 4 is a plan view that schematically illustrates an example of the plurality of pixel units of a liquid crystal device according to the first embodiment of the invention.

FIG. 4 is a plan view that schematically illustrates an example of the configuration of the plurality of pixel units that are arrayed adjacent to one another. FIG. 5 is a sectional view taken along the line V-V of FIG. 4. In referring to FIGS. 4 and 5, it should be noted that different scales are used for layers/members illustrated in these drawings so that each of the layers/members has a size that is easily recognizable in each of these drawings. The same applies for FIG. 6 and subsequent drawings. For convenience of explanation, in FIGS. 4 and 5, layer portions deposited above the pixel electrodes 9a are omitted from these drawings.

As illustrated in FIG. 4, the plurality of pixel electrodes 9a is arranged in a matrix pattern on the TFT array substrate 10. The data line 6a extends along a longitudinal boundary line between each two pixel electrodes 9a arrayed adjacent to each other. On the other hand, the scanning line 11 (i.e., scanning lines 11a and 11b) extends along a latitudinal boundary line between each two pixel electrodes 9a arrayed adjacent to each other. That is, the scanning lines 11a and 11b extend in the X direction, whereas the data lines 6a extend in the Y direction so as to intersect with each of the scanning lines 11a and 11b. At each intersection where the data line 6a and the scanning line 11 traverse, that is, intersect, each other, the pixel-switching TFT 30 is provided.

When viewed in two dimensions, that is, in a plan view, the scanning line 11, the data line 6a, the storage capacitor 70, a relay layer 93, and the TFT 30 are arranged inside a non-open region that provides an isolation between each two adjacent ones of open regions (i.e., aperture regions) of pixels corresponding to the pixel electrodes 9a (where the term "open region" means a region in each pixel which transmits or reflects light that actually contributes to display, whereas the term "non-open region" means a region which blocks and shuts off light) on the TFT array substrate 10. In other words, the scanning line 11, the storage capacitor 70, the data line 6a, and the TFT 30 are arranged not in the open region of each pixel but in the non-open region thereof so as not to obstruct display.

Figure 5:
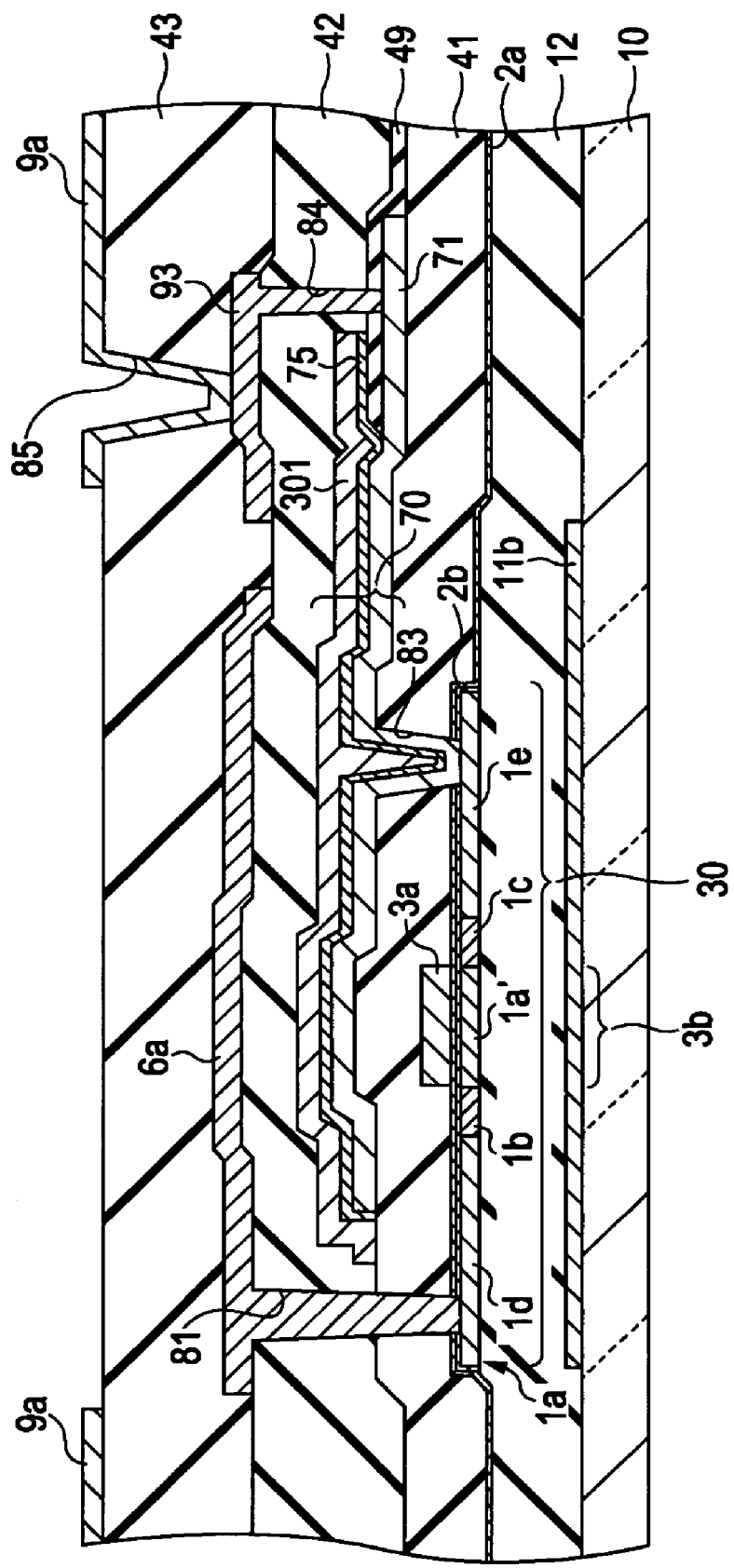
FIG. 5 is a sectional view taken along the line V-V of FIG. 4.

As illustrated in FIGS. 4 and 5, the TFT 30 has the semiconductor layer 1a and the gate electrode 3a.

The semiconductor layer 1a is made of, for example, polysilicon. The semiconductor layer 1a consists of a channel region 1a', a lightly doped source region 1b, a lightly doped drain region 1c, a highly doped source region 1d, and a highly doped drain region 1e. That is, the TFT 30 has a lightly doped drain (LDD) structure. The lightly doped source region 1b, the lightly doped drain region 1c, the highly doped source region 1d, and the highly doped drain region 1e are impurity regions that are formed by implanting impurities into the semiconductor layer 1a by using, for example, an ion implantation method, or other similar alternative technique. According to such an impurity region, it is possible to reduce the amount of an OFF-state current that flows in the source region and the drain region during the non-operating time of the TFT 30, and also to suppress the decrease of an ON-state current that flows during the operating time of the TFT 30. Although it is preferable that the TFT 30 should have an LDD structure, it may be configured to have an offset structure in which the implantation of impurities is not performed on the lightly doped source region 1b and the lightly doped drain region 1c.

As another alternative example, impurities may be heavily doped (i.e., in high concentration) while using the gate electrode 3a as a mask so as to deposit the highly doped source region 1d and the highly doped drain region 1e; that is, it may have a self-aligned structure.

As illustrated in FIGS. 4 and 5, the gate electrode 3a is deposited as a part of the scanning line 11a. The gate electrode 3a is made of, for example, conductive polysilicon. As illustrated in FIG. 4, in addition to the main line portion that extends in the X direction, the scanning line 11a has a sub portion that extends from the main line portion in the Y direction so as to overlap a marginal region of the channel region 1a' of the TFT 30 that does not overlap the main line portion. The portion of the scanning line 11a that overlaps the channel region 1a' in a plan view, or, in other words, the portion of the scanning line 11a that overlies the channel region 1a', but not directly thereon according to the exemplary embodiment illustrated in the drawing, functions as the gate electrode 3a.

As illustrated in FIG. 5, a gate insulation film 2, which is made up of two layers of sub insulation films 2a and 2b, is sandwiched between the gate electrode 3a and the semiconductor layer 1a in the lamination structure formed over the TFT array substrate 10. With such a configuration, the gate electrode 3a and the semiconductor layer 1a are electrically insulated from each other along a direction perpendicular to the surface of the TFT array substrate 10.

As illustrated in FIGS. 4 and 5, a gate electrode 3b, which is deposited at a layer under the semiconductor layer 1a, is formed as a part of the scanning line 11b. As understood from the above explanation and the accompanying drawings, in the configuration of a liquid crystal device according to the present embodiment of the invention, two sub-scanning lines 11a and 11b are provided at a layer above the semiconductor layer 1a and a layer below the semiconductor layer 1a, respectively. In a plan view (refer to FIG. 4), each of the scanning lines 11b, which is formed at a layer below the semiconductor layer 1a, has a main line portion that is configured in a stripe pattern extending along the X direction and an extending portion that extends from the main line portion in the Y direction. The portion of the scanning line 11b that overlaps the channel region 1a' in a plan view, or, in other words, the portion of the scanning line 11b that underlies the channel region 1a', but not directly thereunder according to the exemplary embodiment illustrated in the drawing, functions as the gate electrode 3b. That is, the TFT 30 has a double gate structure. Thus, compared with a case where the gate electrode is formed at either one of the upper layer side and the lower layer side only with respect to the semiconductor layer 1a (i.e., either over or under the semiconductor layer 1a), the configuration of a liquid crystal device according to the present embodiment of the invention makes it possible to make the ON-state current of the TFT 30 relatively large.

The scanning line 11b is made of, for example, an electro-conductive material having light-shielding property such as a high melting point metal material or the like. A couple of examples of such a high melting point metal material include, without any limitation thereto, tungsten (W), titanium (Ti), and titanium nitride (TiN). Accordingly, thanks to the presence of the light-shielding scanning line 11b, which is formed at a layer below the semiconductor layer 1a, it is possible to shut off a return light that enters from the TFT-array-substrate (10) side into the liquid crystal device, thereby effectively protecting the channel region 1a' of the TFT 30.

As illustrated in FIG. 5, the underlying insulation film (i.e., ground insulator film) 12 is interposed between the scanning line 11b, which is formed at a layer below the semiconductor layer 1a, and the semiconductor layer 1a to provide an electrical insulation therebetween. The underlying insulation film 12 has a function of insulating the TFT 30 from the scanning line 11b. In addition thereto, the underlying insulation film 12 that is formed over the entire surface of the TFT array substrate 10 has a function of preventing any degradation in the characteristics and/or performance of the pixel-switching TFT 30 that is attributable to the surface roughness of the TFT array substrate 10 caused at the time of surface polishing thereof or attributable to any stains that remain without being removed completely after washing thereof, though not limited thereto.

As illustrated in FIG. 5, the storage capacitor 70 is provided at a layer above the TFT 30, which is provided over the TFT array substrate 10, with a first inter-bedded insulation film 41 being interposed between the storage capacitor 70 and the TFT 30.

The first inter-bedded insulation film 41 may be made of any of various kinds of silicate glasses such as non-silicate glasses (NSG), phosphorus silicate glass (PSG), boron silicate glass (BSG), and boron phosphorus silicate glass (BPSG). As another non-limiting example, the first inter-bedded insulation film 41 may be made of silicon nitride, silicon oxide, or the like.

The storage capacitor 70 consists of a lower capacitor electrode 71, an upper capacitor electrode 301, and a dielectric film 75, where the lower capacitor electrode 71 and the upper capacitor electrode 301 are opposed to each other with the dielectric film 75 being interposed therebetween.

The upper capacitor electrode 301 is configured as a part of the capacitor line 300. The capacitor line 300 extends, for example, from the image display region 10a, at which the pixel electrodes 9a are provided, to the periphery thereof. The upper capacitor electrode 301, which is electrically connected to a constant potential source via the capacitor line 300, functions as a fixed-electric-potential-side capacitor electrode (i.e., constant-potential-side capacitor electrode) that is maintained at a constant potential. The upper capacitor electrode 301 (or, in other words, the capacitor line 300), which is made of, for example, an opaque metal film containing a metal or an alloy such as Al (aluminum), Ag (silver), and the like, also functions as an upper light-shielding film (built-in light-shielding film) that shuts off incident light that propagates toward the TFT 30 for protection thereof. It should be noted that, in the configuration of a liquid crystal device according to the present embodiment of the invention, the upper capacitor electrode 301 may be made of an elemental metal, an alloy, a metal silicide, a polysilicide, or any lamination thereof, which contains at least one of a high melting point metal including but not limited to titanium (Ti), chromium (Cr), tungsten (W), tantalum (Ta), molybdenum (Mo), and palladium (Pd).

The lower capacitor electrode 71 is electrically connected to the highly doped drain region 1e of the TFT 30 and the pixel electrode 9a. The lower capacitor electrode 71 functions as the pixel-electric-potential-side capacitor electrode. Specifically, the lower capacitor electrode 71 is electrically connected to the highly doped drain region 1e of the TFT 30 via a contact hole 83; and in addition thereto, it is electrically connected to the relay layer 93 via a contact hole 84. In addition, the relay layer 93 is electrically connected to the pixel electrode 9a via a contact hole 85. That is, a combination of the lower capacitor electrode 71 and the relay layer 93 functions to provide an electric relay connection between the highly doped drain region 1e and the pixel electrode 9a. The lower capacitor electrode 71 is made of conductive polysilicon, though not limited thereto. In addition to its function as the pixel-electric-potential-side capacitor electrode, the lower capacitor electrode 71 has another function as a light absorption layer or a light-shielding film that is deposited between the upper capacitor electrode 301, which serves as the upper light-shielding film, and the TFT 30.

The dielectric film 75 has a monolithic structure or multi-tiered structure made of a silicon oxide film including but not limited to an HTO (High Temperature Oxide) film, an LTO (Low Temperature Oxide) film, or of a silicon nitride film, and the like.

In the configuration of a liquid crystal device according to the present embodiment of the invention, a spacer insulation film 49 and a dummy pattern 910 are formed at the same layer as that of the storage capacitor 70. The dummy pattern 910 is made of the same film as that of the spacer insulation film 49. A more detailed explanation of the spacer insulation film 49 and the dummy pattern 910 will be given later while making reference to FIGS. 6 and 7.

As illustrated in FIG. 5, the data lines 6a and the relay layer 93 are provided in an upper layer above the storage capacitor 70, which is formed over the TFT array substrate 10. A second inter-bedded insulation film 42 is interposed between the storage capacitor 70 and the data lines 6a/relay layer 93.

The second inter-bedded insulation film 42 is made of, for example, NSG or the like, which may be the same material as that of the first inter-bedded insulation film 41 described above.

The data line 6a is electrically connected to the highly doped source region 1d of the semiconductor layer 1a via a contact hole 81, which penetrates through the second inter-bedded insulation film 42 and the first inter-bedded insulation film 41. The data line 6a and the inner portion of the contact hole 81 are made of Al (aluminum)-containing material such as Al—Si—Cu, Al—Cu, etc., or aluminum only, or alternatively, a multilayer film that consists of an Al layer and a TiN layer, or the like. The data line 6a has an additional function of shutting light off to protect the TFT 30.

In the illustrated configuration, the relay layer 93 is made of the same film as that of the data line 6a on the second inter-bedded insulation film 42. Therefore, the manufacturing process of a liquid crystal device according to the present embodiment of the invention is simplified because the data line 6a and the relay layer 93 can be formed in the same production step.

As illustrated in FIG. 5, the pixel electrode 9a is formed at the upper-layer side above the data line 6a with a third inter-bedded insulation film 43 being interposed therebetween.

The third inter-bedded insulation film 43 is made of, for example, NSG or the like, which may be the same material as that of the first inter-bedded insulation film 41 and the second inter-bedded insulation film 42 described above. The surface of the third inter-bedded insulation film 43 is planarized (i.e., smoothed). Specifically, the surface of the third inter-bedded insulation film 43 is subjected to chemical mechanical polishing (CMP), which is an example of a "planarization processing" according to the invention. Herein, the method of planarization processing (i.e., smoothing treatment) is not limited to the chemical mechanical polishing. For example, as an alternative method for planarization processing, fluidization treatment may be performed. In the fluidization processing, the third inter-bedded insulation film 43 is subjected to heating for fluidization thereof. In other words, the third inter-bedded insulation film 43 may be subjected to reflow melting. As another alternative method for planarization processing, spin coating may be applied to the third inter-bedded insulation film 43 so as to form a planarization film thereon.

The pixel electrode 9a is electrically connected to the highly doped drain region 1e of the semiconductor layer 1a via the lower capacitor electrode 71, the contact holes 83, 84 and 85, and the relay layer 93. The contact hole 85 is formed by depositing a film of an electro-conductive material such as ITO that constitutes the pixel electrode 9a in the inner wall of a hole that is formed to penetrate through the third inter-bedded insulation film 43. An alignment film that is subjected to a predetermined orientation processing such as rubbing processing or the like is provided on the upper surface of the pixel electrodes 9a.

The configuration of the pixel unit described above is common to each of the pixel units as illustrated in FIG. 4. In the image display region 10a (refer to FIG. 1), the pixel units are provided in a cyclic pattern. On the other hand, in the configuration of a liquid crystal device according to the present embodiment of the invention, as has already been described above while referring to FIGS. 1 and 2, the peripheral circuit section that includes the external circuit connection terminals 102, the data line driving circuit 101, the scanning line driving circuit 104, the inter-substrate conductive terminals 106, and the wiring pattern 90 is formed at the peripheral region around the image display region 10a.

Next, with reference to FIGS. 6 and 7, an exemplary configuration of the spacer insulation film 49 and the dummy pattern 910, the latter of which is made of the same film as that of the former, is explained below. It should be noted that the spacer insulation film 49 and the dummy pattern 910 constitute the distinctively unique feature of a liquid crystal device according to the present embodiment of the invention.

Figure 6:
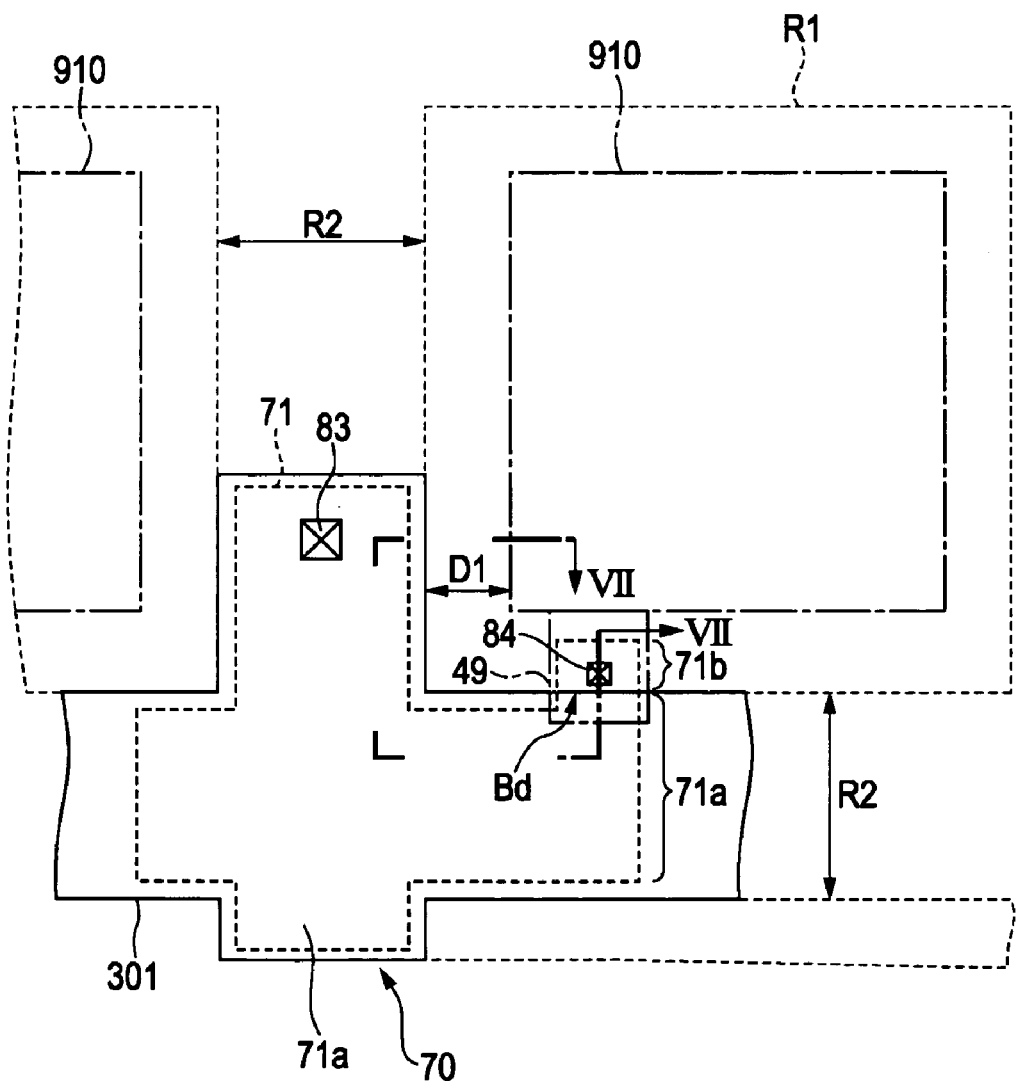
FIG. 6 is a plan view that schematically illustrates an example of the relative layout of, that is, positional relationship between, a storage capacitor, a spacer insulation film, and a dummy pattern according to an exemplary embodiment of the invention.

FIG. 6 is a plan view that schematically illustrates an example of the relative layout of, that is, positional relationship between, an upper capacitor electrode of a storage capacitor, a lower capacitor electrode thereof, a spacer insulation film, and a dummy pattern according to the present embodiment of the invention. FIG. 7 is a sectional view taken along the line VII-VII of FIG. 6. It should be noted that FIG. 7 illustrates a close-up view for explanation of the relative layout of a storage capacitor, a spacer insulation film, and a dummy pattern. Accordingly, the same components as those illustrated in FIG. 5 are not shown therein so as to omit any redundant illustration. The same holds true for FIG. 8.

Figure 7:
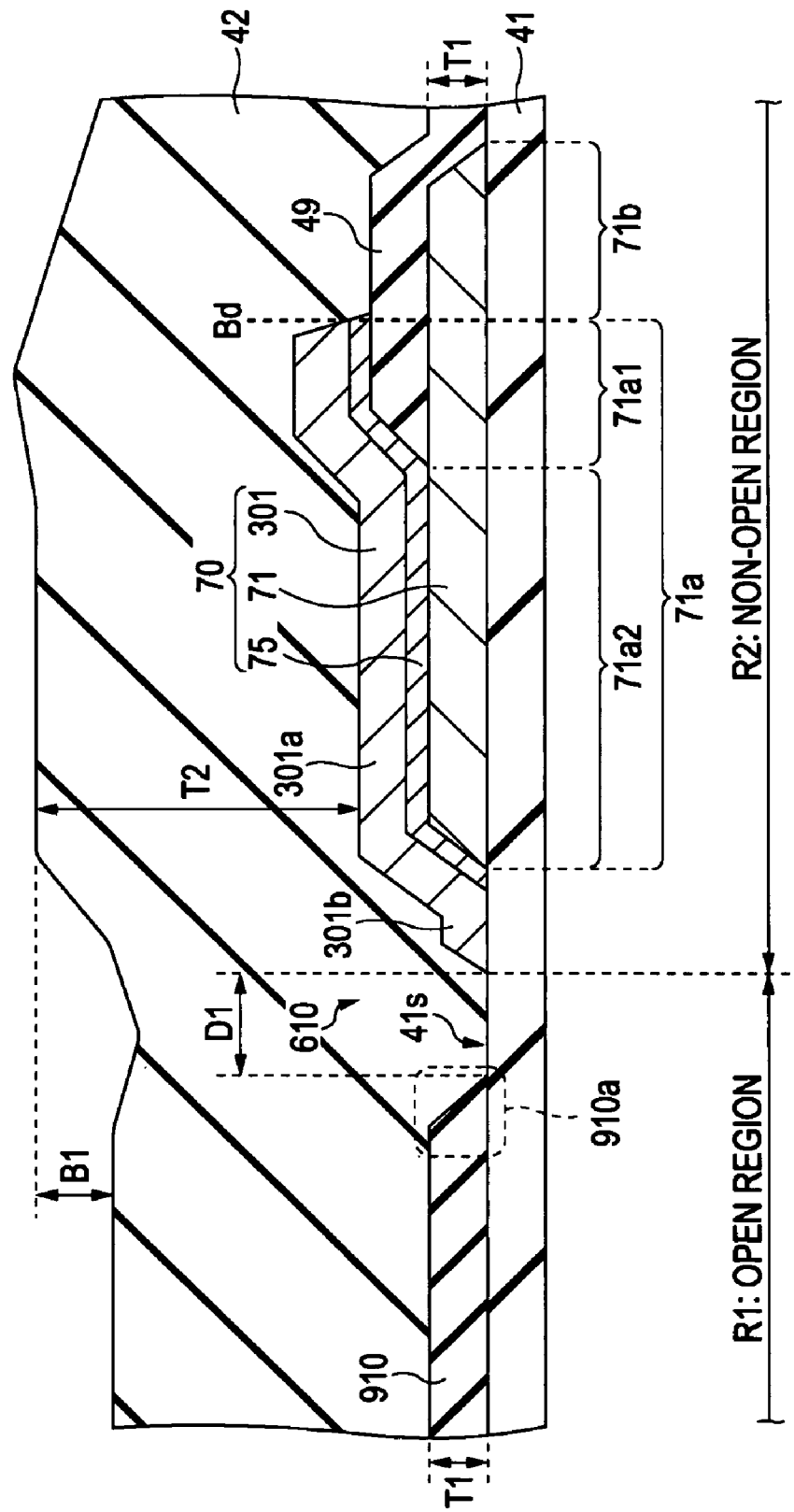
FIG. 7 is a sectional view taken along the line VII-VII of FIG. 6.

As illustrated in FIGS. 6 and 7, the lower capacitor electrode 71, which constitutes a part of the storage capacitor 70, has a lower capacitor electrode main pattern portion 71a and a lower capacitor electrode extension pattern portion 71b. The lower capacitor electrode main pattern portion 71a overlaps the upper capacitor electrode 301 in a plan view over the TFT array substrate 10. The lower capacitor electrode extension pattern portion 71b extends from certain one regional part 71a1 of the lower capacitor electrode main pattern portion 71a in such a manner that the lower capacitor electrode extension pattern portion 71b does not overlap the upper capacitor electrode 301 in a plan view over the TFT array substrate 10. The lower capacitor electrode main pattern portion 71a functions as a capacitor electrode that partially contributes to the capacitance formation of the storage capacitor 70. Since the lower capacitor electrode extension pattern portion 71b does not overlap the upper capacitor electrode 301 in a plan view, the lower capacitor electrode extension pattern portion 71b provides a region at which the contact hole 84, which provides an electric connection between the lower capacitor electrode 71 and the relay layer 93, can be formed in such a manner that the contact hole 84 does not overlap the upper capacitor electrode 301 in a plan view. That is, the lower capacitor electrode extension pattern portion 71b functions as a contact region that electrically connects the lower capacitor electrode 71 and the relay layer 93, or in other words, the lower capacitor electrode 71 and the pixel electrode 9a, which is electrically connected to the relay layer 93 via the contact hole 85.

As illustrated in FIGS. 6 and 7, the spacer insulation film 49 is formed for each storage capacitor 70. The spacer insulation film 49 is formed to completely cover the lower capacitor electrode extension pattern portion 71b. Specifically, the spacer insulation film 49 is formed at a layer above an underlying surface 41s of the lower capacitor electrode 71 (i.e., the upper surface of the first inter-bedded insulation film 41) but below the upper capacitor electrode 301. In a plan view, the spacer insulation film 49 extends across a boundary Bd between the lower capacitor electrode main pattern portion 71a and the lower capacitor electrode extension pattern portion 71b to cover the above-mentioned certain one regional part 71a1 of the lower capacitor electrode main pattern portion 71a. It should be particularly noted that the spacer insulation film 49 does not overlap remaining other regional part 71a2 of the lower capacitor electrode main pattern portion 71a in a plan view. That is, the spacer insulation film 49 is formed to overlie the above-mentioned certain one regional part 71a1 of the lower capacitor electrode main pattern portion 71a and the lower capacitor electrode extension pattern portion 71b (or in other words, the spacer insulation film 49 is formed to include the boundary Bd between the lower capacitor electrode main pattern portion 71a and the lower capacitor electrode extension pattern portion 71b) between the upper capacitor electrode 301 and the lower capacitor electrode 71 in the lamination structure of the TFT array substrate 10. In addition, the spacer insulation film 49 is formed not to overlie the above-mentioned remaining other regional part 71a2 of the lower capacitor electrode main pattern portion 71a. That is, although the dielectric film 75 is formed between the upper capacitor electrode 301 and the above-mentioned remaining other regional part 71a2 of the lower capacitor electrode main pattern portion 71a in the lamination structure of the TFT array substrate 10, the spacer insulation film 49 is not formed therebetween. This means that the above-mentioned remaining other regional part 71a2 of the lower capacitor electrode main pattern portion 71a substantially functions as a capacitor electrode.

Therefore, the spacer insulation film 49 is interposed between the upper capacitor electrode 301 and the above-mentioned certain one regional part 71a1 of the lower capacitor electrode main pattern portion 71a, where the end surface of the upper capacitor electrode 301 lies over the spacer insulation film 49 at the boundary Bd between the lower capacitor electrode main pattern portion 71a and the lower capacitor electrode extension pattern portion 71b. Accordingly, since the spacer insulation film 49 is interposed at the boundary Bd between the lower capacitor electrode main pattern portion 71a and the lower capacitor electrode extension pattern portion 71b, in comparison with a case where the spacer insulation film 49 is not provided therebetween at the boundary Bd, it is possible to increase the inter-bedded distance between the end surface of the lower capacitor electrode 71 and the end surface of the upper capacitor electrode 301. By this means, it is possible to prevent the occurrence of end surface electric current leakage. In addition, when an etching treatment or other similar treatment is applied at the above-mentioned certain one regional part 71a1 of the lower capacitor electrode main pattern portion 71a so as to etch away the upper capacitor electrode 301, the presence of the spacer insulation film 49 ensures that the lower capacitor electrode 71 is protected from an etchant so that it is not subjected to any unintended etching thereof. Therefore, the invention makes it possible to effectively avoid the generation of end surface electric current leakage due to the propinquity (i.e., nearness or close arrangement) of the end surface of the upper capacitor electrode 301 and the end surface of the lower capacitor electrode 71. It should be noted that the layer position of the spacer insulation film 49 could be modified in such a manner that it is formed between the dielectric film 75 and the upper capacitor electrode 301 in the lamination structure of the TFT array substrate 10.

As illustrated in FIGS. 6 and 7, the upper capacitor electrode 301 has an upper capacitor electrode main pattern portion 301a and an upper capacitor electrode extension pattern portion 301b. The upper capacitor electrode main pattern portion 301a overlaps the lower capacitor electrode main pattern portion 71a in a plan view. The upper capacitor electrode extension pattern portion 301b extends onto the underlying surface 41s of the lower capacitor electrode 71 in such a manner that the upper capacitor electrode extension pattern portion 301b does not overlap the lower capacitor electrode 71 in a plan view. The upper capacitor electrode extension pattern portion 301b extends from the upper capacitor electrode main pattern portion 301a, which overlies the lower capacitor electrode main pattern portion 71a, onto the underlying surface 41s in such a manner that the upper capacitor electrode extension pattern portion 301b covers the end surface of the above-mentioned remaining other regional part 71a2 of the lower capacitor electrode main pattern portion 71a. With such a configuration, it is possible to increase the capacitance area by effectively utilizing the end surface of the above-mentioned remaining other regional part 71a2 of the lower capacitor electrode main pattern portion 71a. Therefore, it is possible to increase a capacitance value in a non-open region R2, which is a space-limited area over the TFT array substrate 10, without any necessity to increase the layout area of the storage capacitor 70 itself over the TFT array substrate 10. As an example of modified configurations, the upper capacitor electrode extension pattern portion 301b may be formed over the underlying surface 41s of the lower capacitor electrode 71 with the dielectric film 75 being interposed therebetween.

With the configuration of a liquid crystal device according to the present embodiment of the invention, which is provided with the storage capacitor 70 having a layer pattern structure described above, it is possible to display a high-quality image with great brightness and high contrast.

As illustrated in FIGS. 6 and 7, in the configuration of a liquid crystal device according to the present embodiment of the invention, the dummy pattern 910, which is made of the same film as that of the spacer insulation film 49, is formed in an open region R1 of each pixel (pixel electrode 9a).

That is, the dummy pattern 910 is formed concurrently with the spacer insulation film 49 in the same single film formation process in the manufacturing of a liquid crystal device according to the present embodiment of the invention. This further means that the dummy pattern 910 and the spacer insulation film 49 are configured as the same single kind of film. The dummy pattern 910 is formed in an "island-shape" in the center of the open region R of each of the plurality of pixel electrodes 9a that are arrayed in a matrix pattern in the image display region 10a. With such a layout configuration, the dummy pattern 910 is also arrayed in a matrix pattern. The dummy pattern 910 and the spacer insulation film 49 are formed together as a single sheet of film having a "non-isolated pattern". Notwithstanding the foregoing, the dummy pattern 910 and the spacer insulation film 49 may be isolated (i.e., have an isolated pattern) from each other although they constitute the same single kind of film.

Thanks to the presence of the dummy pattern 910, it is possible to decrease the difference in the surface level of the lamination structure formed at the open region R1 and the surface level of the lamination structure formed at the non-open region R2 over the TFT array substrate 10, where the surface level difference is denoted as B1 in the drawing. That is, since the dummy pattern 910, which is made of the same film as that of the spacer insulation film 49, is formed in the open-region R1 of the pixel electrode 9a, it is possible to "imitate" the raised lamination surface level of the lamination structure in the non-open region R2 thereof due to the film thickness T1 of the spacer insulation film 49 that is formed therein. In other words, thanks to the presence of the dummy pattern 910, it is possible to almost eliminate any significant unevenness in the lamination surface formed in the open region R1 and the non-open region R2 over the TFT array substrate 10. Thus, after application of planarization processing such as CMP to the surface of the third inter-bedded insulation film 43, which the pixel electrode 9a is formed on, for elimination of unevenness thereof, the configuration of a liquid crystal device according to the present embodiment of the invention makes it possible to enhance the surface smoothness of the third inter-bedded insulation film 43. By this means, it is possible to reduce the adverse possibility of disarrangement in the orientation state of liquid crystal.

In addition, as has already been described above, the dummy pattern 910 is made of the same film as that of the spacer insulation film 49. Therefore, advantageously, the configuration of a liquid crystal device according to the present embodiment of the invention does not require any more complex lamination structure of the TFT array substrate 10 or any more complex manufacturing steps at all. Or, even when a slight and/or minor complication thereof is involved, the configuration of a liquid crystal device according to the present embodiment of the invention does not sacrifice the simple lamination structure of the TFT array substrate 10 or simple manufacturing steps thereof.

As illustrated in FIGS. 6 and 7, in the configuration of a liquid crystal device according to the present embodiment of the invention, a gap interval D1, which is the distance between (the tip of) the upper capacitor electrode extension pattern portion 301b and (the tip of) an edge portion 910a of the dummy pattern 910 that "faces" the upper capacitor electrode extension pattern portion 301b, is smaller than twice of a value obtained by multiplying the film thickness T2 of the second inter-bedded insulation film 42 by the coverage percentage Cv1 of the second inter-bedded insulation film 42. In this context as well as in the recitation of appended claims, the edge portion 910a "faces" the upper capacitor electrode extension pattern portion 301b does not necessarily mean that, as illustrated in the drawing, these surfaces "facing" each other are parallel with each other. That is, this aspect of the invention is applicable as long as these surfaces opposite to each other form a gap distance therebetween. The coverage percentage Cv1 is defined as a percentage in terms of which the second inter-bedded insulation film 42 covers the upper capacitor electrode extension pattern portion 301b (or, the dummy pattern 910). Specifically, the coverage percentage Cv1 is mathematically defined as the ratio of the film thickness Ta of a layer portion that covers the upper surface of the upper capacitor electrode extension pattern portion 301b to the film thickness Tb of a layer portion that covers the side surface thereof, where the film thickness Ta of the layer portion that covers the upper surface of the upper capacitor electrode extension pattern portion 301b is equivalent to the film thickness T1 of the spacer insulation film 49. This is mathematically expressed as follows: Coverage Percentage Cv1=Film Thickness Tb/Film Thickness Ta. Thus, the following mathematical expression can be deduced: Gap Distance D1<Film Thickness T2×Coverage Percentage Cv1×2.

For the purpose of hypothetical explanation, it is assumed herein that the gap distance D1 is larger than twice of a value obtained by multiplying the film thickness T2 of the second inter-bedded insulation film 42 by the coverage percentage Cv1 of the second inter-bedded insulation film 42, or equal thereto at the smallest, it follows that a concave portion 610 that is formed by three surfaces, specifically, the edge (i.e., side) surface of the dummy pattern 910, the underlying surface 41s of the lower capacitor electrode 71, and the opposite "facing" (i.e., side) surface of the upper capacitor electrode extension pattern portion 301b, has a width that is not smaller than the sum of the film thickness of a layer portion of the second inter-bedded insulation film 42 that covers the opposite (i.e., side) surface of the upper capacitor electrode extension pattern portion 301b and a layer portion of the second inter-bedded insulation film 42 that covers the edge (i.e., side) surface of the dummy pattern 910. Therefore, in such a hypothetical configuration, it is practically impossible, or at least difficult, to fill up such a wide concave portion (610) completely by means of the second inter-bedded insulation film 42. That is, there is a risk that a large difference in the surface level of the second inter-bedded insulation film 42 occurs due to such a wide concave portion (610).

In contrast, in the configuration of a liquid crystal device according to the present embodiment of the invention, the gap distance D1 is configured to meet the mathematical formula described above, that is: Gap Distance D1<Film Thickness T2×Coverage Percentage Cv1×2. Therefore, it is possible to form the concave portion 610, which is formed as a combination of the edge surface of the dummy pattern 910, the underlying surface 41s of the lower capacitor electrode 71, and the opposite surface of the upper capacitor electrode extension pattern portion 301b, in such a manner that it has a relatively small width. Thus, in the configuration of a liquid crystal device according to the present embodiment of the invention, it is possible to fill up the concave portion 610 completely, or almost completely, by means of the second inter-bedded insulation film 42, thereby effectively reducing the surface level difference of the lamination structure (second inter-bedded insulation film 42).

Figure 8:
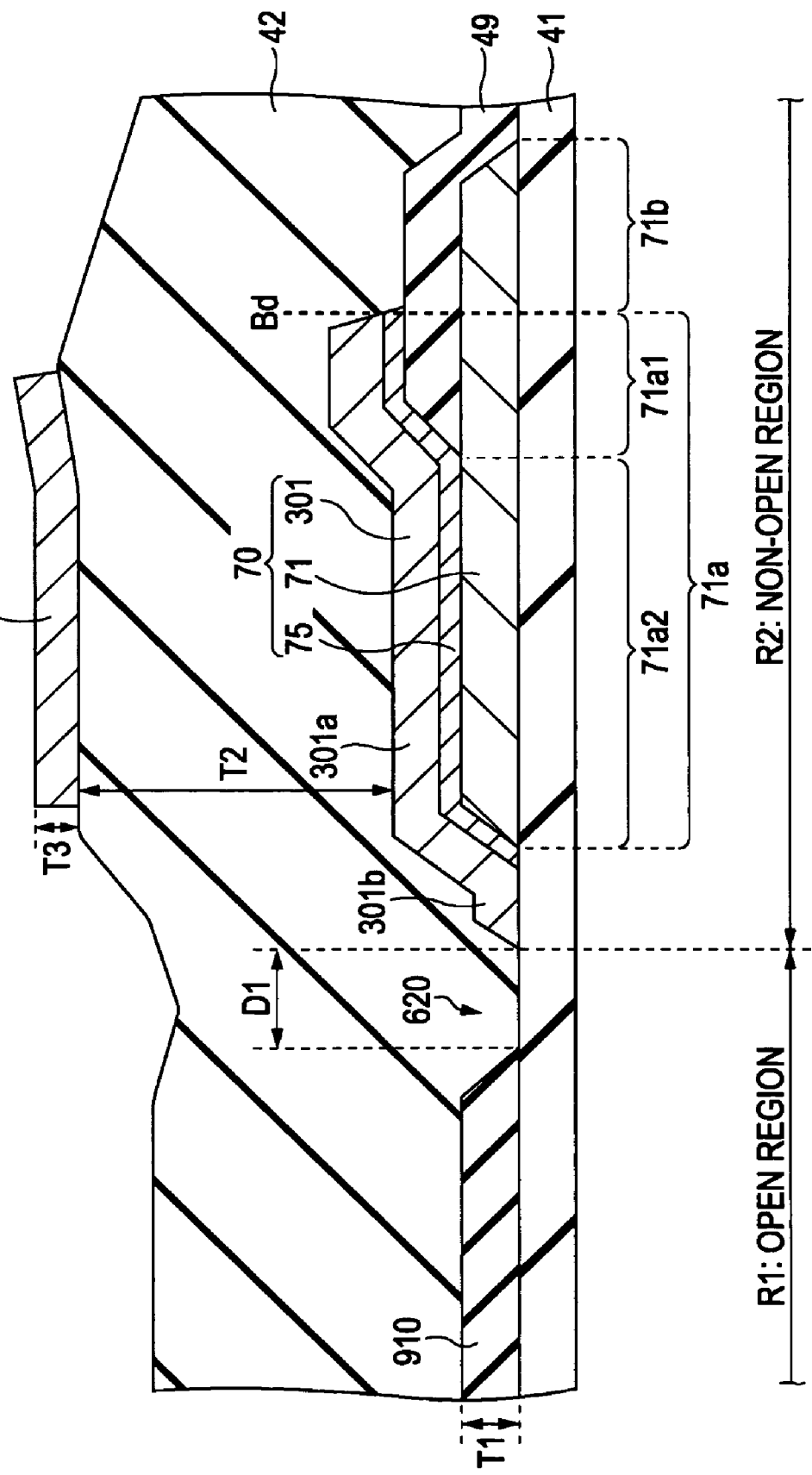
FIG. 8 is a sectional view that schematically illustrates a first variation of the exemplary embodiment of the invention, seen from the same viewpoint as taken in FIG. 7.

FIG. 8 is a sectional view that schematically illustrates an exemplary variation of the present embodiment of the invention, seen from the same viewpoint as taken in FIG. 7.

As illustrated in a modification example of FIG. 8, a wiring 810 that is made of an electro-conductive film may be formed on the second inter-bedded insulation film 42, where the gap distance D1 is larger than twice of a value obtained by multiplying the film thickness T3 of the wiring 810 by the coverage percentage Cv2 of the wiring 810. That is, the configuration of a liquid crystal device according to the present embodiment of the invention may be modified in such a manner that the following equality is true: Gap Distance D1>Film Thickness T3×Coverage Percentage Cv2×2. With such a configuration, it is possible to widen a concave portion 620, which is formed as a combination of the edge surface of the dummy pattern 910, the underlying surface 41s of the lower capacitor electrode 71, and the opposite surface of the upper capacitor electrode extension pattern portion 301b, to a degree where there is no adverse effect on the formation of the wiring 810. That is, in the manufacturing process of the wiring 810, which is performed by, as a first step, forming a precursor film, that is, a pre-etching film, on the entire surface of the second inter-bedded insulation film 42 over the TFT array substrate 10, and as a second step, by applying an etching treatment on the formed precursor film so as to form the wiring 810, it is possible to prevent any part of the precursor film from remaining without being removed in the corresponding concave portion formed in the surface of the second inter-bedded insulation film 42, which is attributable to the presence of the concave portion 620. In other words, if the corresponding concave portion formed in the surface of the second inter-bedded insulation film 42 is too narrow because of the narrow width of the concave portion 620, it will be difficult to etch away the portion of the precursor film that is filled in the above-mentioned narrow concave portion. In contrast, the modified configuration described above makes it possible to avoid such a difficulty in etching removal thereof.

As has already been described above while referring to FIGS. 1 and 2, in the configuration of a liquid crystal device according to the present embodiment of the invention, a peripheral circuit unit (peripheral circuit section) that includes, without any limitation thereto, driving circuits such as the scanning line driving circuit 104 and the data line driving circuit 101 as well as the wiring pattern 90 is formed at the peripheral region that surrounds the image display region 10*a*. The peripheral circuit unit is made of the same film as a semiconductor film or an electro-conductive film that constitutes a variety of electronic elements or wirings/lines such as the TFT 30, the storage capacitor 70, and the like that are formed in each of the plurality of pixels. The peripheral circuit unit formed at the peripheral region has a layout density (i.e., convex/concave density) that is higher than that of the TFTs 30, the storage capacitors 70, the data lines 6*a*, or the scanning lines 11 that are formed in the image display region 10*a*. Accordingly, the dummy pattern 910 that is formed in each of the open regions R1 of the image display region 10*a* makes it possible to effectively reduce the undulation or surface level difference due to the convex/concave density over the TFT array substrate 10, which is referred to as a global level difference. Therefore, a liquid crystal device according to the present embodiment of the invention features great flatness in the lamination surface of the TFT array substrate 10 that is almost free from the global level difference. With such a unique configuration, it is possible to reduce the adverse possibility of disarrangement in the orientation state of the liquid crystal layer 50, which makes it further possible to offer a high-quality display image. If there is the above-mentioned global level difference, contrast unevenness and/or brightness unevenness might be observed as a perceivable difference between the central region of the image display region 10*a* and the peripheral region thereof. In contrast, the configuration of a liquid crystal device according to the present embodiment of the invention makes it possible to effectively reduce or prevent the generation of such display unevenness.

A dummy pattern that is made of the same film as that of the spacer insulation film 49 may be formed as, for example, a "solid" pattern in the peripheral region. If so configured, it is possible to reduce the global level difference that could occur in the lamination surface of the TFT array substrate 10 even in a case where the density of the peripheral circuit unit in the peripheral region is relatively low.

As explained above, with the configuration of a liquid crystal device according to the present embodiment of the invention, since the dummy pattern 910 that is made of the same film as that of the spacer insulation film 49 is provided in the open region R1 of each of the plurality of pixel electrodes 9*a*, it is possible to reduce the difference in the surface level between the lamination structure formed in the open region R1 of the TFT array substrate 10 and the surface level of the lamination structure formed in the non-open region R2 thereof. By this means, it is possible to enhance the surface flatness of the TFT array substrate 10.

Production Method

In the following description, manufacturing steps for producing a liquid crystal device according to the exemplary embodiment of the invention described above is explained with reference to FIGS. 9-11.

Figure 9:
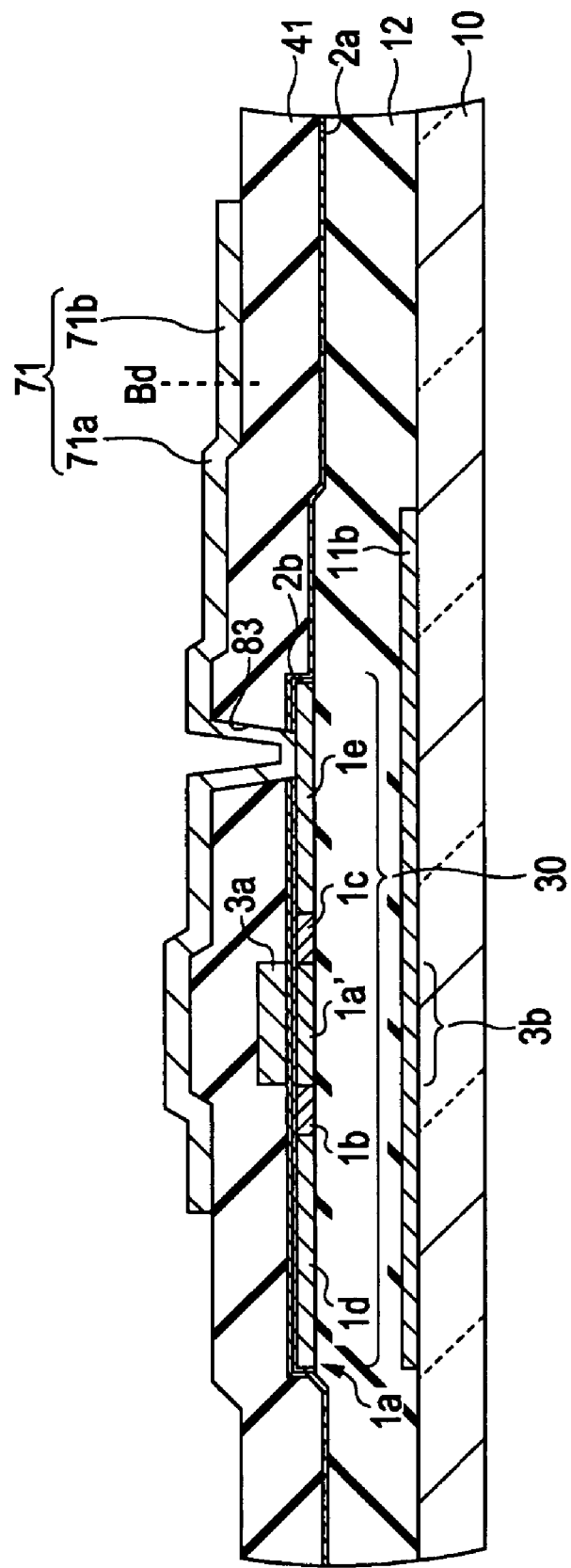
FIG. 9 is a sectional view (Part I) that schematically illustrates an exemplary part of a series of production steps/processes adopted for manufacturing a liquid crystal device according to the first embodiment of the invention.
Figure 11:
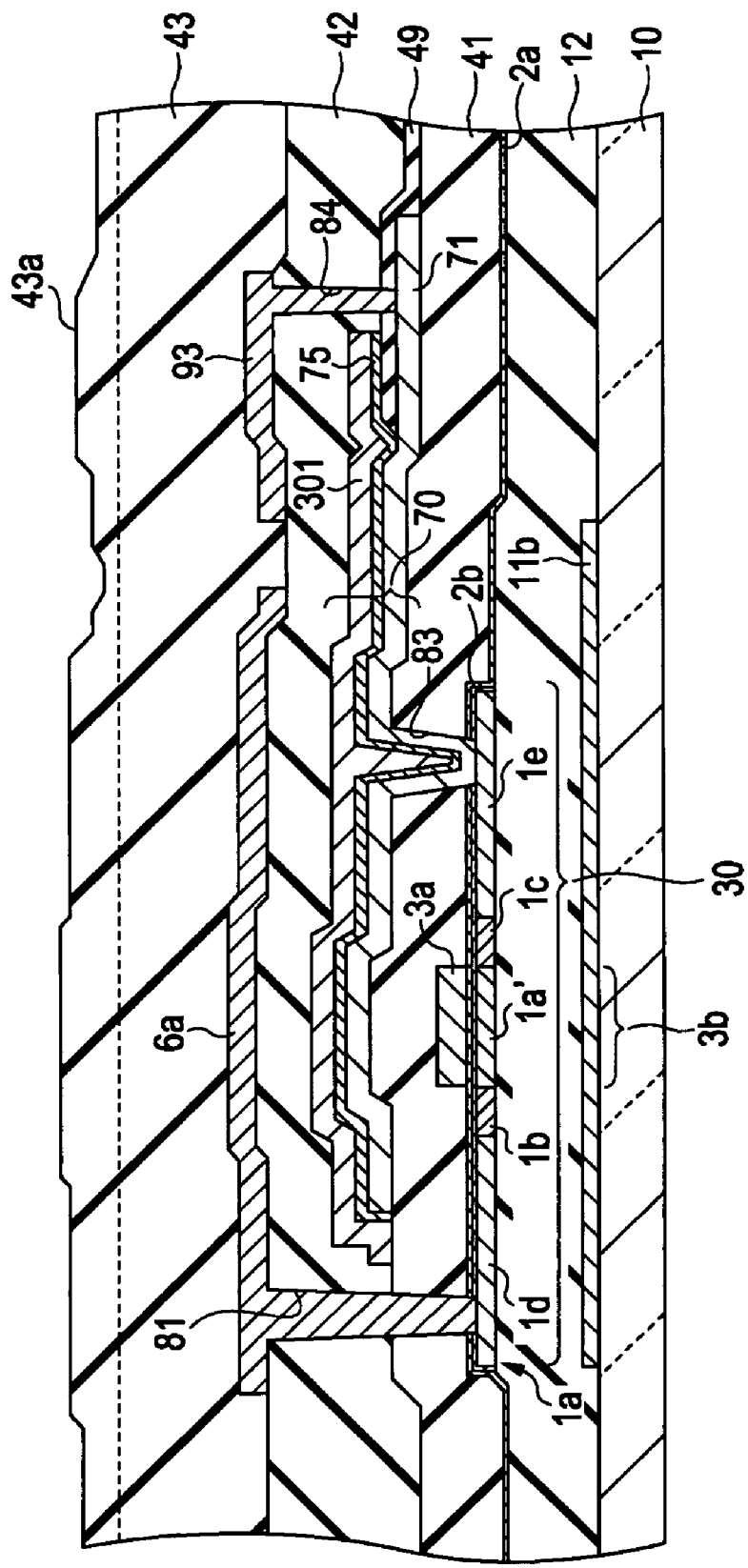
FIG. 11 is a sectional view (Part III) that schematically illustrates an exemplary part of the series of production steps/processes adopted for manufacturing a liquid crystal device according to the first embodiment of the invention.

Each of FIGS. 9-11 is a sectional view that schematically illustrates an exemplary part of a series of production processes adopted for manufacturing a liquid crystal device according to the exemplary embodiment of the invention described above. It should be noted that each of FIGS. 9 and 11 corresponds to the sectional view of FIG. 5, whereas FIG. 10 corresponds to the sectional view of FIG. 7. In the following description, the processes of forming a scanning line, a TFT, a data line, a storage capacitor, and a pixel electrode, which constitute the major components in the configuration of a liquid crystal device according to the exemplary embodiment of the invention described above, are mainly explained. In particular, a detailed explanation is given of the processes of forming the storage capacitor and the dummy pattern.

First of all, in the manufacturing step illustrated in FIG. 9, a lamination structure from the scanning line 11*b* to the first inter-bedded insulation film 41 is formed on the TFT array substrate 10. In this manufacturing step, the TFT 30 is provided at a position corresponding to an intersection that is formed by the scanning line 11, which is made up of the sub-scanning lines 11*a* and 11*b*, and the data line 6*a*, which has not been formed yet at this formation stage. In each layer formation (sub-)step, a known semiconductor integration technique can be used. After the formation of the first inter-bedded insulation film 41, the surface thereof may be subjected to planarization processing by means of CMP or the like.

Next, an etching treatment is applied to a predetermined position on the surface off the first inter-bedded insulation film 41 so as to form the contact hole 81 that has a depth reaching the highly doped drain region 1*e*. Subsequently, for example, a conductive polysilicon film is deposited thereon in a predetermined pattern so as to form the lower capacitor electrode 71. In the above-mentioned formation process, the lower capacitor electrode 71 is configured to have the lower capacitor electrode main pattern portion 71*a* and the lower capacitor electrode extension pattern portion 71*b* (refer to FIG. 10B), where the lower capacitor electrode main pattern portion 71*a* overlaps, in a plan view, the upper capacitor electrode 301, which has not been formed yet at this formation stage, whereas the lower capacitor electrode extension pattern portion 71*b* extends from the above-mentioned certain one regional part 71*a*1 of the lower capacitor electrode main pattern portion 71*a* in such a manner that the lower capacitor electrode extension pattern portion 71*b* does not overlap the upper capacitor electrode 301 in a plan view.

Next, in the manufacturing step illustrated in FIG. 10A, a transparent insulation film is deposited over the first inter-bedded insulation film 41 and the lower capacitor electrode 71. Then, a resist 500 having a predetermined pattern is formed so as to cover the selected region of the insulation film where the spacer insulation film 49 and the dummy pattern 910 should be formed. Thereafter, an etchant is applied thereto so as to form the spacer insulation film 49 and the dummy pattern 910. In the formation process described above, the spacer insulation film 49 is configured not to overlie the above-mentioned remaining other regional part 71*a*2 of the lower capacitor electrode main pattern portion 71*a* but to overlie both the lower capacitor electrode extension pattern portion 71*b* and the above-mentioned certain one regional part 71a1 of the lower capacitor electrode main pattern portion 71a. In addition, the dummy pattern 910 is formed in an island pattern in the open region R1 as has already been explained above while making reference to FIG. 6. In the configuration of a liquid crystal device according to the exemplary embodiment of the invention described above, the dummy pattern 910 is made of the same film as that of the spacer insulation film 49. Therefore, it does not add any undesirable extra complexity to the existing manufacturing steps thereof.

Next, in the production process illustrated in FIG. 10B, the dielectric film 75 is deposited by means of a sputtering method, a chemical vapor deposition method (CVD), or the like. Thereafter, the upper capacitor electrode 301 is formed on the dielectric film 75.

Next, a resist 510 having a predetermined pattern is deposited on the upper capacitor electrode 301, which is followed by an etching treatment. Through the etching treatment, the upper capacitor electrode 301 and the dielectric film 75 are "cut" so as to form the storage capacitor 70 for each of the plurality of pixels. In the above-mentioned formation process, the upper capacitor electrode 301 is configured to have the upper capacitor electrode main pattern portion 301a and the upper capacitor electrode extension pattern portion 301b, where the upper capacitor electrode main pattern portion 301a overlaps the lower capacitor electrode main pattern portion 71a in a plan view, whereas the upper capacitor electrode extension pattern portion 301b extends from the upper capacitor electrode main pattern portion 301a in such a manner that the upper capacitor electrode extension pattern portion 301b does not overlap the lower capacitor electrode 71 in a plan view.

Next, in the production process illustrated in FIG. 11, the second inter-bedded insulation film 42 is deposited. Then, an etching treatment is applied to predetermined positions on the surface of the second inter-bedded insulation film 42 so as to form the contact holes 81 and 84. Next, the data line 6a and the relay layer 93 are formed on the second inter-bedded insulation film 42. The data line 6a is configured to contact the highly doped source region 1d via the contact hole 81 that penetrates through the second inter-bedded insulation film 42 and the first inter-bedded insulation film 41. On the other hand, the relay layer 93 is configured to contact the lower capacitor electrode 71, or more specifically, the lower capacitor electrode extension pattern portion 71b via the contact hole 84 that penetrates through the second inter-bedded insulation film 42 and the spacer insulation film 49.

Next, a precursor film 43a of the third inter-bedded insulation film 43 is formed on the entire region of a lamination structure that has been formed so far over the TFT array substrate 10. The surface of the precursor film 43a has unevenness due to the presence of the storage capacitor 70, the spacer insulation film 49, and the like formed thereunder. In order to address the unevenness problem thereof, the precursor film 43a is formed to have a redundant film thickness. Then, the redundant part of the precursor film 43a that is over the dotted line in the drawing is removed by means of, for example, CMP. In this way, the third inter-bedded insulation film 43 having a planarized surface is obtained. In the formation process described above, since the dummy pattern 910 is formed concurrently with the spacer insulation film 49 in the same single film formation process as has already been described above, where the dummy pattern 910 is made of the same film as that of the spacer insulation film 49, it is possible to obtain the third inter-bedded insulation film 43 having an enhanced surface flatness.

Then, an etchant is applied to a predetermined position on the surface of the third inter-bedded insulation film 43 so as to form the contact hole 85 (refer to FIGS. 4 and 5). Subsequently, the pixel electrode 9a is formed at a predetermined position on the surface of the third inter-bedded insulation film 43 (refer to FIGS. 4 and 5).

With a method for producing a liquid crystal device described above, it is possible to manufacture a liquid crystal device according to the foregoing exemplary embodiment of the invention described above. In particular, it is possible to improve the surface flatness of the TFT array substrate 10 without adding any undesirable extra complexity to the existing manufacturing steps thereof because the dummy pattern 910 is made of the same film as that of the spacer insulation film 49.

Electronic Apparatus

Next, an explanation is given on the application of the above-described liquid crystal device, which is an example of an electro-optical device, to various kinds of electronic apparatuses. In the following description, an explanation is given of a projector that employs the above-described liquid crystal device as a light valve.

Figure 12:
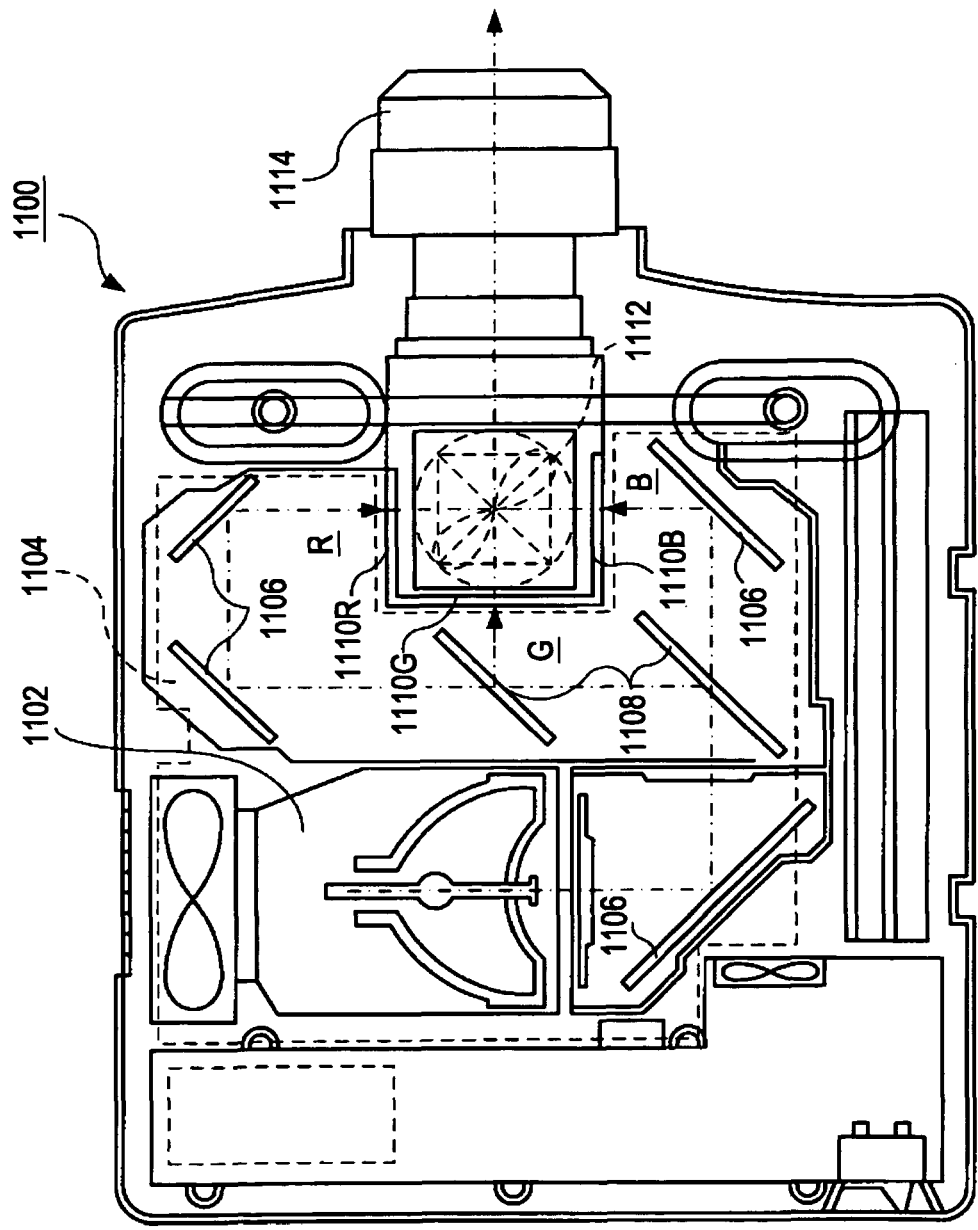
FIG. 12 is a plan view that schematically illustrates an example of the configuration of a projector, which is an example of electronic apparatuses to which an electro-optical device according to the invention is applied.

FIG. 12 is a plan view that schematically illustrates an example of the configuration of a projector.

As illustrated in FIG. 12, a lamp unit 1102, which is made of a white light source such as a halogen lamp, is provided in a projector 1100. A projection light that is emitted from the lamp unit 1102 is separated into three primary color components of R, G, and B by four mirrors 1106 and two dichroic mirrors 1108 arranged in a light guide 1104. The separated primary color components of R, G, and B enter liquid crystal panels 1110R, 1110B, and 1110G, respectively, which function as light valves corresponding to the respective primary color components.

The configuration of the liquid crystal panel 1110R, 1110G, or 1110B is the same as or similar to that of the liquid crystal device described above. Each of these liquid crystal panels 1110R, 1110G, and 1110B is driven by the corresponding one of the primary color signals R, G, and B, which are supplied from the image signal processing circuit. Light subjected to optical modulation by one of these liquid crystal panels enters a dichroic prism 1112 from the corresponding one of three directions. Light of R color component and light of B color component are refracted at a 90-degree angle at the dichroic prism 1112, whereas light of G color component goes straight through the dichroic prism 1112. Therefore, as a result of combination of these color components, a color image is projected on a screen, etc., through a projection lens 1114.

Focusing attention on a display image offered by each of the liquid crystal panels 1110R, 1110G, and 1110B, it is necessary to reverse the display image of the liquid crystal panel 1110G in a mirror pattern (that is, reverse the left side and the right side) with respect to the display images of the liquid crystal panels 1110R and 1110B.

Because light corresponding to each one of the primary colors R, G, and B enters into the corresponding one of the liquid crystal panel 1110R, 1110G, and 1110B thanks to the presence of the dichroic mirror 1108, it is not necessary to provide a color filter thereon.

Among a variety of electronic apparatuses to which the electro-optical device according to the invention could be embodied are, in addition to the electronic apparatus (projector) explained above with reference to FIG. 12, a mobile-type personal computer, a mobile phone, a liquid crystal display television, a viewfinder-type video recorder, a video recorder of a direct monitor view type, a car navigation device, a pager, an electronic personal organizer, an electronic calculator, a word processor, a workstation, a videophone, a POS terminal, a touch-panel device, and so forth. Needless to say, the invention is also applicable to these various electronic apparatuses without any limitation to those mentioned above.

In addition to the liquid crystal device explained in the embodiments described above, the invention is also applicable to a reflective liquid crystal display which has elements formed on a silicon substrate (LCOS, liquid crystal on silicon), a plasma display (PDP), a field emission display (FED), a surface-conduction electron-emitter display (SED), an organic EL display, a digital micro mirror device (DMD), an electrophoresis apparatus, to name a few.

The present invention should in no case be interpreted to be limited to the specific embodiments described above. The invention may be modified, altered, changed, adapted, and/or improved within a range not departing from the gist and/or spirit of the invention apprehended by a person skilled in the art from explicit and implicit description given herein as well as appended claims. An electro-optical device subjected to such a modification, alteration, change, adaptation, and/or improvement, a method for producing such an electro-optical device, and an electronic apparatus that is provided with such an electro-optical device are also within the technical scope of the invention.

What is claimed is:

1. An electro-optical device comprising:
a substrate;
a pixel including an open region and a non-open region that partitions the open region, the open region including a pixel electrode;
an inter-bedded insulation film formed over the substrate in a layer below the pixel electrode;
a storage capacitor formed over the substrate in a layer below the pixel electrode with at least the inter-bedded insulation film being interposed therebetween, the storage capacitor having a lower capacitor electrode, a dielectric film, and an upper capacitor electrode that are disposed successively one on the other in this order, the lower capacitor electrode including a main portion and an extension portion, the main portion overlapping the upper capacitor electrode in a plan view and the extension portion that extends from one part of the lower capacitor electrode main portion, the lower capacitor electrode extension portion being in a non-overlapping condition with the upper capacitor electrode in a plan view;
an underlying surface disposed below the lower capacitor electrode;
a spacer insulation film formed over the substrate which is formed at a layer above the underlying surface and below the upper capacitor electrode, the spacer insulation film extending across a boundary between the main portion and the extension portion of the lower capacitor electrode in a plan view to cover the one part of the main portion, the spacer insulation film being in a non-overlapping condition with an other part of the main portion in a plan view; and
a first dummy pattern formed in the open region over the substrate, the first dummy pattern being made of the same film as that of the spacer insulation film,
wherein the upper capacitor electrode has an upper capacitor electrode main portion that overlaps the lower capacitor electrode main portion in a plan view and an upper capacitor electrode extension portion that extends from the upper capacitor electrode main portion to an end of the upper capacitor electrode in such a manner that the upper capacitor electrode extension portion does not overlap the lower capacitor electrode in a plan view and the upper capacitor electrode extension portion does not overlap the spacer insulation film in a plan view.

2. The electro-optical device according to claim 1, wherein any one or more of the above-mentioned at least one inter-bedded insulation film is subjected to planarization processing.

3. The electro-optical device according to claim 1, further comprising a first inter-bedded insulation film as the above-mentioned at least one inter-bedded insulation film, the first inter-bedded insulation film being formed above the upper capacitor electrode, wherein a gap distance between the upper capacitor electrode extension portion and an edge portion of the first dummy pattern that faces the upper capacitor electrode extension portion is smaller than twice of a value obtained by multiplying a film thickness of the first inter-bedded insulation film by a coverage percentage of the first inter-bedded insulation film.

4. The electro-optical device according to claim 3, further comprising a first wiring that is made of an electro-conductive film, the first wiring being formed on the first inter-bedded insulation film, wherein the gap distance is larger than twice of a value obtained by multiplying a film thickness of the first wiring by a coverage percentage of the first wiring.

5. The electro-optical device according to claim 1, further comprising a peripheral circuit section that is formed at a peripheral region that surrounds a pixel region over the substrate, the peripheral circuit section functioning to drive the pixel.

6. The electro-optical device according to claim 5, further comprising a second dummy pattern that is formed in the peripheral region, the second dummy pattern being made of the same film as that of the spacer insulation film.

7. An electronic apparatus that is provided with the electro-optical device according to claim 1.

8. The electro-optical device according to claim 1, wherein the upper capacitor electrode includes a first extension portion and a second extension portion, the first extension portion extending in a first direction and the second extension extending in a second direction intersecting the first direction, the extension portion of the lower capacitor electrode protruding beyond an edge of the first extension portion of the upper capacitor electrode in the second direction.

9. The electro-optical device according to claim 8, wherein the second extension portion of the upper capacitor electrode and the first dummy pattern are separated by a gap.

* * * * *